United States Patent
Then et al.

(10) Patent No.: US 10,811,526 B2
(45) Date of Patent: Oct. 20, 2020

(54) STACKED GROUP III-NITRIDE TRANSISTORS FOR AN RF SWITCH AND METHODS OF FABRICATION

(71) Applicant: Intel Corporation, Santa Clara, CA (US)

(72) Inventors: Han Wui Then, Portland, OR (US); Marko Radosavljevic, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/461,353

(22) PCT Filed: Dec. 30, 2016

(86) PCT No.: PCT/US2016/069499
§ 371 (c)(1),
(2) Date: May 15, 2019

(87) PCT Pub. No.: WO2018/125211
PCT Pub. Date: Jul. 5, 2018

(65) Prior Publication Data
US 2020/0058782 A1 Feb. 20, 2020

(51) Int. Cl.
*H01L 29/778* (2006.01)
*H01L 29/10* (2006.01)
(Continued)

(52) U.S. Cl.
CPC ...... *H01L 29/7783* (2013.01); *H01L 29/1033* (2013.01); *H01L 29/2003* (2013.01); *H01L 29/42316* (2013.01)

(58) Field of Classification Search
CPC .................................................. H01L 29/7783
(Continued)

(56) References Cited

U.S. PATENT DOCUMENTS

2011/0057233 A1 3/2011 Park et al.
2013/0001646 A1 1/2013 Corrion et al.
(Continued)

FOREIGN PATENT DOCUMENTS

WO WO-2016048328 3/2016

OTHER PUBLICATIONS

International Search Report and Written Opinion for International Patent Application No. PCT/US2016/069499, dated Jul. 11, 2019, 8 pages.
(Continued)

*Primary Examiner* — Ajay Arora
(74) *Attorney, Agent, or Firm* — Schwabe, Williamson & Wyatt, P.C.

(57) ABSTRACT

A semiconductor device includes a silicon pillar disposed on a substrate, the silicon pillar has a sidewall. A group III-N semiconductor material is disposed on the sidewall of the silicon pillar. The group III-N semiconductor material has a sidewall. A doped source structure and a doped drain structure are disposed on the group III-N semiconductor material. A polarization charge inducing layer is disposed on the sidewall of the group III-N semiconductor material between the doped drain structure and the doped source structure. A plurality of portions of gate dielectric layer is disposed on the sidewalls of the group III-N semiconductor material and between the polarization charge inducing layer. A plurality of resistive gate electrodes separated by an interlayer dielectric layer are disposal adjacent to each of the plurality of portions of the gate dielectric layer. A source metal layer is disposed below and in contact with the doped source structure.

22 Claims, 23 Drawing Sheets

(51) Int. Cl.
*H01L 29/20* (2006.01)
*H01L 29/423* (2006.01)

(58) Field of Classification Search
USPC .......................................................... 257/194
See application file for complete search history.

(56) References Cited

U.S. PATENT DOCUMENTS

2014/0151747 A1* 6/2014 Jeon .................. H01L 29/42316
257/194
2014/0374765 A1 12/2014 Curatola
2020/0194312 A1* 6/2020 Then ..................... H01L 29/778

OTHER PUBLICATIONS

International Search Report and Written Opinion for International Patent Application No. PCT/US2016/069499 dated Sep. 21, 2017, 11 pgs.

* cited by examiner

STACKED GROUP III-NITRIDE TRANSISTORS FOR AN RF SWITCH AND METHODS OF FABRICATION

CROSS-REFERENCE TO RELATED APPLICATION

This patent application is a U.S. National Phase Application under 35 U.S.C. § 371 of International Application No. PCT/US2016/069499, filed Dec. 30, 2016, entitled "STACKED GROUP III-NITRIDE TRANSISTORS FOR AN RF SWITCH AND METHODS OF FABRICATION," which designates the United States of America, the entire disclosure of which is hereby incorporated by reference in its entirety and for all purposes.

TECHNICAL FIELD

Embodiments of the present invention generally relate to microelectronic devices and their methods of fabrication, and more particularly to formation of a stack of group III-N transistors for an RF switch.

BACKGROUND

In the fields of wireless communication and power management, various components can be implemented using solid-state devices. For example, in radio frequency (RF) communication, the RF front-end is a generic term for the circuitry between an antenna and a digital baseband system. Such RF front-end components may include RF switches. Due, in part, to their large bandgap and high mobility, gallium nitride (GaN) and other group III-Nitride (N) semiconductor materials are suited for integrated circuits for applications such as high-frequency and high-power switches, but may present challenges arising from scaling. Reliable manufacturing processes that produce such integrated circuits may require RF switches to be formed in a manner that overcome area limitations. One method of overcoming scaling is to form RF switches by stacking multiple transistors made from group III-N semiconductor material.

BRIEF DESCRIPTION OF THE DRAWINGS

FIG. 2 illustrates the formation of a multilayer stack including alternating layers of ILD (interlayer dielectric) and gate electrode material formed on a dielectric layer above a substrate.

FIG. 3 illustrates the structure of FIG. 2 following the formation first and a second patterned multilayer stack to expose the underlying source metal layer.

FIG. 4 illustrates the structure of FIG. 3 following the formation of a gate dielectric layer on the surface of the source metal layer and on sidewalls and on the uppermost surface of the first and second patterned multilayer stack.

FIG. 5 illustrates the structure of FIG. 4 following the formation on of a second dielectric layer in a region between the first and second patterned multilayer stack.

FIG. 6 illustrates the structure of FIG. 5 following the formation of a trench in the second dielectric layer, the gate dielectric layer, source metal layer and the insulator layer to expose the underlying substrate.

FIG. 7 illustrates the structure of FIG. 6 following the growth of epitaxial silicon in the trench from the substrate.

FIG. 8 illustrates the structure of FIG. 7 following the removal of the second dielectric layer exposing the vertical sidewalls of the epitaxially grown silicon.

FIG. 9 illustrates the structure of FIG. 8 following the growth of a group III-N semiconductor material on the vertical sidewalls of the epitaxially grown silicon.

FIG. 10 illustrates the structure of FIG. 9 following a process to planarize the group III-N semiconductor material and the silicon pillar and recess the group III-N semiconductor material.

FIG. 11 illustrates the structure of FIG. 10 following the removal of a portion of the ILD layer adjacent to the gate dielectric layer from each ILD layer in the material layer stack.

FIG. 12 illustrates the structure of FIG. 11 following the removal of the gate dielectric layer from portions of the vertical sidewalls of the group III-N semiconductor material.

FIG. 13 illustrates the structure of FIG. 12 following the formation of a polarization charge inducing layer on the exposed surfaces of the group III-N semiconductor material.

FIG. 14 illustrates the structure of FIG. 13 following the formation of a high K dielectric layer on the sidewalls and the uppermost surface of the polarization charge inducing layer and on the sidewalls and on the uppermost surface of the top most ILD layer.

FIG. 15 illustrates the structure of FIG. 14 following the removal of the polarization charge inducing layer from the uppermost surface of the group III-N semiconductor material and the formation of a recess in a portion of the first dielectric layer.

FIG. 16 illustrates the structure of FIG. 15 following the formation of a drain and a source structure on the exposed surfaces of the group III-N semiconductor material FIG. 17 illustrates the structure of FIG. 16 following the formation of a plurality of resistive gate electrodes in the first and in the second multilayered stacks.

FIG. 18 illustrates the structure of FIG. 17 following the formation of drain, gate and source contacts.

DESCRIPTION OF THE EMBODIMENTS

Figure 1A:
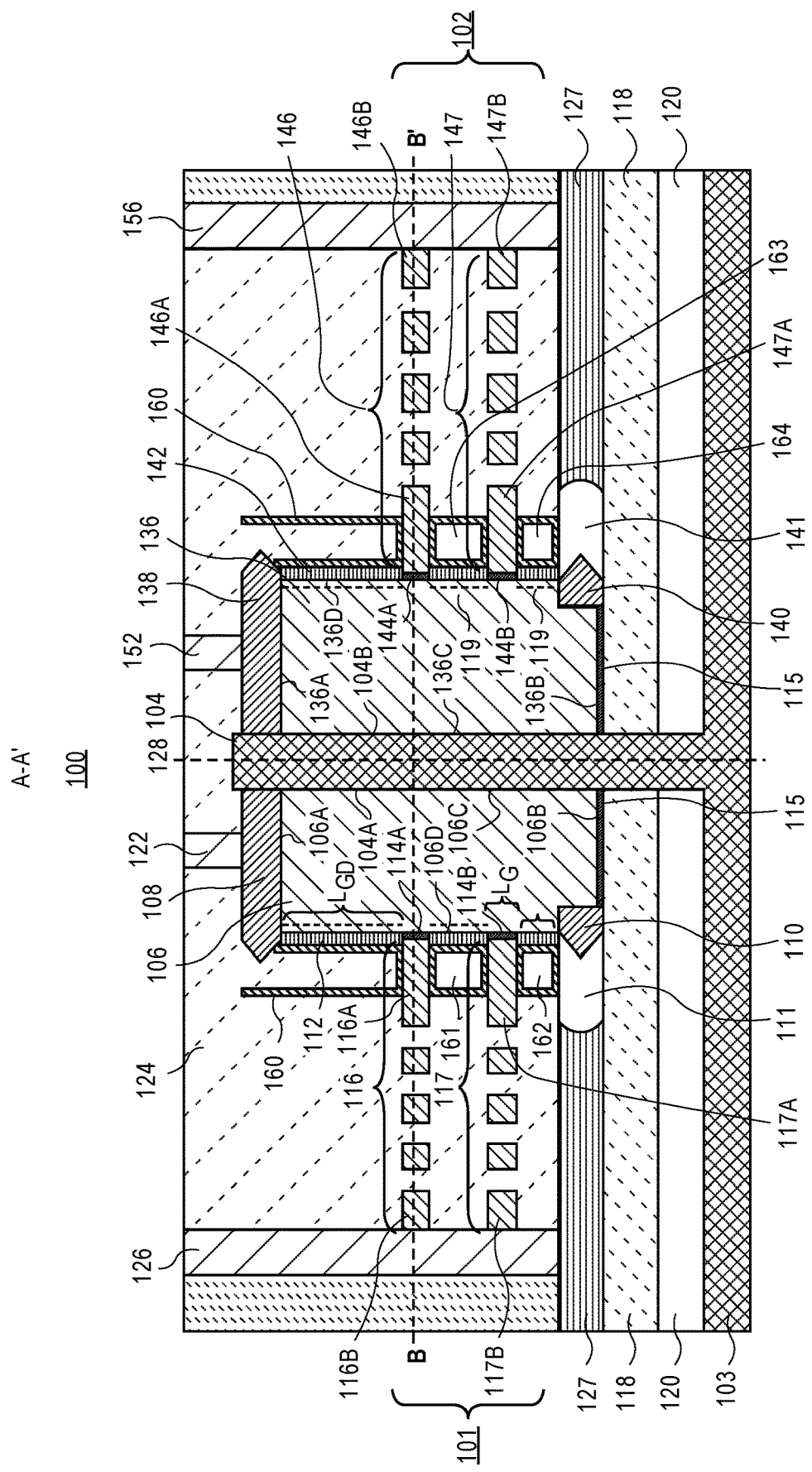
FIG. 1 illustrates a cross-sectional view, a plan view, and an angled view of a first stack and a second stack of group III-N transistors formed above a substrate.

Stacked group III-N transistors for logic, system-on-chip (SoC), radio frequency (RF) components and memory applications and their methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as operations associated with group III-N transistor, are described in lesser detail in order to not unnecessarily obscure embodiments of the present invention. Furthermore, it is to be understood that the various embodiments shown in the Figures are illustrative representations and are not necessarily drawn to scale.

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

RF switches are used in RF front end circuits to help route RF signals between the antenna, RF filters, RF power amplifiers and RF low noise amplifiers. While RF switches can be manufactured using planar transistors with each transistor connected to a resistor element, the end product may be limited in scope, the manufacturing technique may be cumbersome and the devices can take up precious real estate from an ever shrinking chip area. RF switch circuits in planar semiconductor devices occupy relatively large areas of the wafer surface where typical transistor widths are in millimeters and connecting resistors occupying additional squared millimeter of area. Hence, innovative techniques to fabricate a larger number of such semiconductor RF switches in a same footprint of space is desirable as semiconductor devices continue to scale down in size. One way to enable scaling while producing high quality RF switches for front end circuit applications may be to form RF switches from group III-N transistors that are stacked vertically. For RF switch applications, each group III-N transistor has a gate that is further required to be isolated from a gate contact by a resistor measuring 50 Kohm to 100 Kohm. Furthermore, the stacked group III-N transistor and resistor combination in the RF switch structure is connected in series so that each transistor acts as a RF voltage divider. In this regard, each gate of the stacked group III-N transistor is energized simultaneously to act as a voltage divider. Integration schemes that can co-fabricate multiple group III-N transistors and resistors stacked, one on top of another with layers of isolation between them are highly desirable. If such schemes can be carried out by minimizing additional process steps and utilize standard processing materials, then cost advantages may also be realized.

An embodiment of the present invention is a semiconductor device having a plurality of a stack of group III-N transistors with resistive gate electrodes. In an embodiment, a semiconductor device includes a silicon pillar disposed on a substrate. A group III-N semiconductor material is disposed on a sidewall of the silicon pillar. A doped source structure and a doped drain structure are disposed on the group III-N semiconductor material and are spaced apart from one another. First and second gate dielectric and resistive gate electrode pairs are formed along the sidewall of the group III-N semiconductor material, between the doped source structure and the doped drain structure. A polarization charge inducing layer is disposed between the doped drain structure and the first gate dielectric and resistive gate electrode pair, between the first and second gate dielectric and resistive gate electrode pairs, and between the second gate dielectric and resistive gate electrode pair and the doped source structure. Each of the resistive gate electrodes includes a gate electrode on the corresponding gate dielectric, and a serpentine-shaped resistor. When the first and second resistive gate electrodes are on, a voltage between the doped source structure and the doped drain structure is divided between first and second transistors that include the first and second resistive gate electrodes, respectively. In one such embodiment, additional resistive gate electrodes are included between the doped source structure and the doped drain structure to further divide the voltage. By stacking group III-N transistors with resistive gate electrodes in a vertical arrangement, a high voltage switch may be created in a reduced die area, enabling integration with silicon-based CMOS logic.

In a further embodiment, a second plurality of a stack of group III-N transistors with resistive gate electrodes is symmetrically disposed on another sidewall of the silicon pillar. In an embodiment, plurality of a stack of group III-N transistors with resistive gate electrodes, such as symmetrically arranged first and second plurality of a stack of group III-N transistors with resistive gate electrodes, are coupled together to increase the current capacity of a switch fabricated from the plurality of a stack of group III-N transistors with resistive gate electrodes.

Figure 1B:
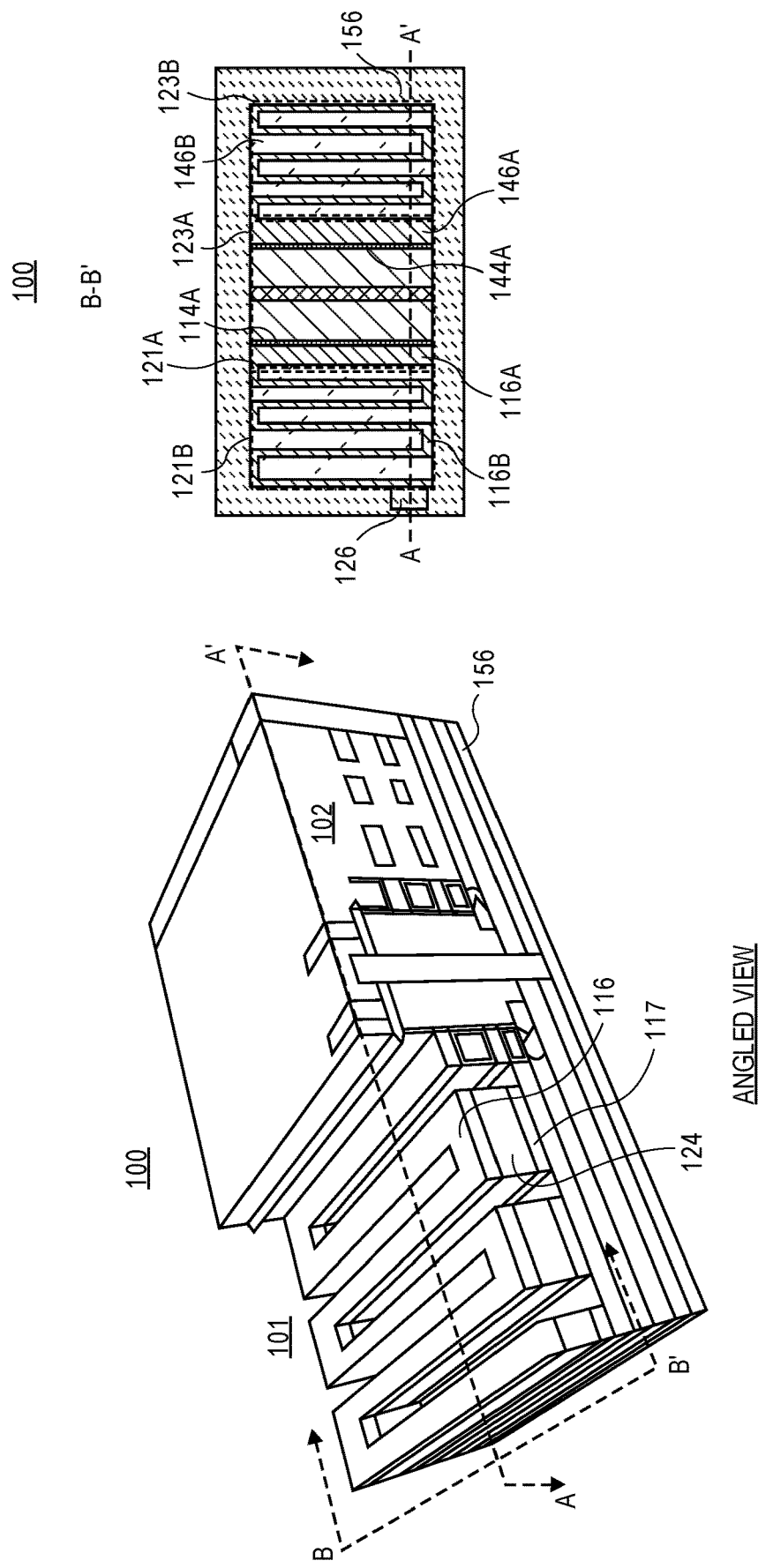

FIG. 1 illustrates a cross-sectional view, a top down view, and an angled view of a semiconductor device 100, in accordance with an embodiment of the present invention. A vertical cut along the direction A-A' illustrates the cross-sectional illustration in FIG. 1 and a lateral cut along the dashed line B-B' indicates the plan view B-B' in FIG. 1.

In an embodiment, the semiconductor device 100 includes a first stack 101 of group III-N transistors formed above a substrate 103, such as a silicon substrate. In an embodiment, the first stack 101 of group III-N transistors includes a silicon pillar 104 disposed on the substrate 103. The silicon pillar 104 has a first sidewall 104A and a second sidewall 104B opposite to the first sidewall 104A. A first group III-N semiconductor material 106 is disposed on the first sidewall 104A of the silicon pillar 104. In an embodiment, the first group III-N semiconductor material 106 has an uppermost surface 106A, a lower most surface 106B, a first sidewall 106C adjacent to the first sidewall 104A of the silicon pillar 104 and a second sidewall 106D opposite to the first sidewall 106C. A first doped drain structure 108 is disposed on the uppermost surface 106A of the first group III-N semiconductor material 106. A first doped source structure 110 is disposed on the second sidewall 106D of the first group semiconductor material 106 in an opening 111. A first polarization charge inducing layer 112 is disposed on the second sidewall 106D of the first group III-N semiconductor material 106 between the first doped drain structure 108 and the first doped source structure 110. A first gate dielectric layer 114A and a second gate dielectric layer 114B are disposed on the second sidewall 106D of the first group III-N semiconductor material 106. The first gate dielectric layer 114A and the second gate dielectric layer 114B are separated by the first polarization charge inducing layer 112. A first resistive gate electrode 116 is disposed adjacent to the first gate dielectric layer 114A, and a second resistive gate electrode 117 is disposed adjacent to the second gate dielectric layer 114B. A source metal 108 is disposed below the first group III-N semiconductor material 106 and above an isolation layer 120. A first drain contact 122 is disposed on the first doped drain structure 108. A first gate contact 126 is disposed adjacent to and in electrical contact with the first and second resistive gate electrodes 116 and 117, respectively and above a dielectric layer 127. An interlayer dielectric (ILD) material 124 is disposed above the dielectric layer 127, between the first and the second resistive gate electrode layers 116 and 117, respectively, and above the first resistive gate electrode 116.

In an embodiment, the semiconductor device 100 includes a second stack 102 of group III-N transistors. The second stack 102 of group III-N transistors mirrors the first stack 101 of group III-N transistors about the dashed vertical line 128 (in the middle of the silicon pillar 104). In an embodiment, the second stack 102 of group III-N transistors. Includes a second group III-N semiconductor material 136 disposed on the second sidewall 104B of the silicon pillar 104. In an embodiment, the second group III-N semiconductor material 136 has an uppermost surface 136A, a lower most surface 136B, a first sidewall 136C adjacent to the second sidewall 104B of the silicon pillar 104 and a second sidewall 136D opposite to the first sidewall 136C. A second doped drain structure 138 is disposed on the uppermost surface 136A of the second group III-N semiconductor material 136. A second doped source structure 140 is disposed on the second sidewall 136D of the second group III-N semiconductor material 136 in an opening 141. A second polarization charge inducing layer 142 is disposed on the second sidewall 136D of the second group III-N semiconductor material 136 between the second doped drain structure 138 and the second doped source structure 140. A third gate dielectric layer 144A and a fourth gate dielectric layer 144B are disposed on the second sidewall 136D of the second group III-N semiconductor material 136. The first gate dielectric layer 144A and the second gate dielectric layer 144B are separated by the second polarization charge inducing layer 142. A third resistive gate electrode 146 is disposed adjacent to the third gate dielectric layer 144A and a fourth resistive gate electrode 147 is disposed adjacent to the fourth gate dielectric layer 144B. The source metal 118 is disposed below the second group III-N semiconductor material 136 and above the isolation layer 120. A second drain contact 152 is disposed above the second doped drain structure 138 in the interlayer dielectric (ILD) material 124. A second gate contact 156 is disposed adjacent to and in electrical contact with the third and fourth resistive gate electrodes 146 and 147, respectively and above the dielectric layer 127. The interlayer dielectric (ILD) material 124 is disposed below the fourth resistive gate electrode 147, between the third and the fourth resistive gate electrodes 146 and 147, respectively, and above the third resistive gate electrode 146.

In an embodiment, the first polarization charge inducing layer 112 introduces a polarization difference in the sidewall 106C of the first group III-N semiconductor material 106 creating a conducting sheet of charge known as a 2 dimensional electron gas (2 DEG—represented by dashed lines 119) in the first group III-N semiconductor material 106. The 2 DEG is present between the first doped drain structure 108 and the first gate dielectric layer 114A, between the first gate dielectric layer 114A and the second gate dielectric layer 114B, and between the second gate dielectric layer 114B and the doped source structure 110. There is no 2 DEG in the first group III-N semiconductor material 106 adjacent to the first gate dielectric layer 114A or the second gate dielectric layer 114B.

When a positive bias voltage, greater or equal to the threshold voltage, $V_T$, is applied simultaneously on the first and second resistive gate electrodes 116 and 117, respectively, channels are formed in the group III-N semiconductor material 116 adjacent to the respective first and second gate dielectric layer 114A and 114B. Formation of channels enables current flow between the first doped source structure 110 and the first doped drain structure 108.

It is to be appreciated that the first stack 101 of group III-N transistors functions as a voltage divider when the transistors are biased at below the threshold voltage. When a bias voltage, $V_{DS}$ is applied between the doped drain structure 108 and the doped source structure 110, the voltage, $N_{DS}$ is divided among the first and the second gate electrodes 116 and 117, respectively. In an embodiment, the amount of voltage drop across the first gate electrode 116 and the second gate electrode 117 depends on the gate length, Lg, of the first and second gate electrode 116 and 117, respectively. In an embodiment, the gate length, Lg of the first and the second gate electrodes are equivalent. In an alternative embodiment, the gate length, Lg of the first and the second gate electrodes are not equivalent. In one such embodiment, a proportionately equal amount of voltage drop occurs between the first and the second gate electrodes 116 and 117, respectively. Depending on the embodiment, the number of resistive gate electrodes in the first stack 101 of group III-N transistors can range from 2-14. In an embodiment, by increasing the number of resistive gate electrodes in a stacked group III-N transistor 101, a higher voltage, $V_{DS}$, may be applied between the doped drain structure 108 and the doped source structure 110.

The plan view of FIG. 1 refers to a cut along the dashed line B-B' in the cross-sectional illustration A-A' of FIG. 1. In an embodiment, the first resistive gate electrode 116 includes a first gate electrode 116A (inside dashed lines 121A) that is in contact with the first gate dielectric layer 114A and a first resistive element 116B (inside dashed lines 121B) that is contiguous with the first gate electrode 116A. The first resistive element 116B is between the first gate electrode 116A and the first gate contact 126. The first resistive element 116B enables the first gate electrode 116A to be isolated from the first gate contact 126 by a resistive element. In an embodiment, the resistive element has a resistance of at least 50 Kohm, and in one embodiment is between 50 Kohm to 200 Kohm. In one embodiment, the first resistive element 116B has a serpentine shape, as is depicted. Similarly, in an embodiment, the second resistive gate electrode 117 includes a second gate electrode 117A that is in contact with the second gate dielectric layer 114B and a second resistive element 117B that is contiguous with the second gate electrode 117A.

Referring to FIG. 1 B-B', in an embodiment, the third resistive gate electrode 146 includes a third gate electrode 146A (inside dashed lines 123A) that is in contact with the third gate dielectric layer 144A and a third resistive element 146B (inside dashed lines 123B) that is contiguous with the third gate electrode 146A. In an embodiment, the fourth resistive gate electrode 147 includes a fourth gate electrode 147A that is in contact with the fourth gate dielectric layer 144B and a fourth resistive element 147B (plan view not shown).

In an embodiment, the first stack 101 and second stack 102 of group III-N transistors have an equal number of resistive gate electrodes as illustrated in FIG. 1. In other embodiments, first stack 101 and second stack 102, of group III-N transistors have unequal number of resistive gate electrodes. Referring again to FIG. 1 (angled view), gate electrodes and serpentine shape resistors of the first and second resistive gate electrodes 116 and 117, respectively are highlighted following a peel back of a portion of the ILD layer 124.

In an embodiment, each of the first, second, third or fourth resistive elements 116B, 117B, 146B or 147B, respectively, has a resistance of at least 50 Kohm, and in one embodiment is between 50 Kohm to 200 Kohm. Referring again to the plan view in FIG. 1 (B-B'), in an embodiment, the number of turns in the first resistive element 116B, influences the total resistance of the first resistive element 116B the greater the number of turns the greater the total resistance. That is, by increasing the number of turns per unit area in the first resistive element 116B, the total resistance can be increased. To this effect, by doubling the number of turns, the resistance of the first resistive element 116B can be increased by approximately two-fold. In a different embodiment, by increasing the number of turns per unit area of the resistive element 116B, the total resistance can also be increased.

In an embodiment, the number of turns in the first resistive element 116B and 117B in the first stack 101 of group III-N transistors is the same as the number of turns in the third and fourth serpentine shape resistors 146B and 147B, respectively in the second stack 102 of group III-N transistors. In another embodiment, the number of turns in the first and second resistive element 116B and 117B, respectively is less than the number of turns in the third and fourth serpentine shape resistors 146B and 147B, respectively. However, it is to be appreciated that in an embodiment, the first and second resistive element 116B and 117B, respectively, have a resistance that is approximately equal to each other. Similarly, in an embodiment, the third and fourth resistive element 146B and 147B, respectively, have a resistance that is approximately equal to each other. All four same In an embodiment, the first resistive gate electrode 116 is distant from the first doped drain structure 108 by a distance $L_{GD}$, denoted as a gate to drain separation distance. The second gate electrode 117 is separated from the first source structure 110 by a distance $L_{GS}$, denoted as a gate to source separation distance. In an embodiment, the distances $L_{GD}$ and $L_{GS}$ are of equal lengths. In other embodiments, the distance $L_{GS}$ is less than the distance $L_{GD}$ as illustrated in FIG. 1. The distance $L_{GD}$, influences the breakdown voltage, $V_{BD}$ between the first resistive gate electrode 116 and the first doped drain structure 108. In an embodiment, an $L_{GD}$ of at least 100 nm enables the first stack 101 of group III-N transistors to have a breakdown voltage that is greater than 8V. Due to symmetry arguments, a similar analysis can be made about the relative spacing between the third and fourth gate resistive gate electrodes 146 and 147, respectively and the second doped drain structure 138 and second doped source structure 140, respectively.

In an embodiment, a high K dielectric layer 160 is disposed in a lateral opening 161 between first resistive gate electrode 116 and the second resistive gate electrode 117 and in the lateral opening 162 below the second resistive gate electrode 117. In an embodiment, high K dielectric layer 160 is also disposed in a lateral opening 163 between third resistive gate electrode 146 and the fourth resistive gate electrode 147 and in the lateral opening 164 below the fourth resistive gate electrode 147. In an embodiment, the high K dielectric layer 160 has portions that are adjacent to the first and second polarization charge inducing layers 112 and 114.

In an embodiment the source metal layer 118 is continuous between the first stack 101 of group III-N transistors and the second stack 102 of group III-N transistor. In one such embodiment, the first stack 101 of group III-N transistors and the second stack 102 of group III-N transistor are electrically coupled at the source and at the drain. In an embodiment, the source metal layer 118 is not a continuous layer and the first stack 101 of group III-N transistors can be operated independently from the second stack 102 of group III-N transistors. In an embodiment, the first stack 101 and the second stack 102 of group III-N transistors can be electrically coupled at the source, drain and gate to form a device having a larger current capacity.

In an embodiment, a portion of a fifth gate dielectric layer 115 is disposed above the source metal layer 118 and under the first group III-N semiconductor material 106 and under the second group III-N semiconductor material 136. In an embodiment, a first portion of the fifth gate dielectric layer 115 extends between the first doped source structure 110 and the sidewall 104A of the silicon pillar 104 and a second portion extends between the second sidewall 104B of the silicon pillar 104 and the second doped source structure 140.

Referring to FIG. 1, in an embodiment, the first, second, third and fourth resistive gate electrodes 116, 117, 146 and 147, respectively include a metal such as tungsten or a metal alloy such as TiN or TaN. In an embodiment, the first, second, third and fourth resistive gate electrodes 116, 117, 146 and 147, respectively have a thickness that is in the range of 30-250 nm.

In an embodiment, the first, second, third and fourth and fifth gate dielectric layers 114A, 114B, 134A, 134B and 115, respectively include a gate dielectric material such as but not limited to $SiO_2$, SiON, AlN, AlON. In an embodiment, the first, second, third and fourth and fifth gate dielectric layers 114A, 114B, 134A, 134B and 115, respectively have a thickness that is in the range of 3 nm-10 nm.

In an embodiment, the first group III-N semiconductor material 106 is a GaN layer. In one such embodiment, the group III-N semiconductor material 106 has a relatively high carrier mobility, (greater than 500 $cm^2$ $V^{-1}$). In one such embodiment, the group III-N semiconductor material 106 is a substantially undoped group III-N semiconductor material (i.e., $O_2$ impurity concentration minimized) to minimize impurity scattering. In other embodiments, group III-N semiconductor material 106 includes one or more ternary alloys of GaN, such as AlGaN, AlInN, or a quaternary alloy of GaN including at least one group III element and nitrogen, such as $In_xAl_yGa_{1-x-y}N$, where x ranges from 0.01-0.1 and y ranges from 0.01-0.1. In an embodiment, the group III-N semiconductor material 106 has a material thickness in the range of 100 nm-5 um. In an embodiment, the second group III-N semiconductor material 136 is a material with characteristics and thickness that is substantially similar to the material and thickness of the first group III-N semiconductor material 106.

Referring again to FIG. 1, in an embodiment, the first polarization charge inducing layer 112 includes a polarization difference inducing material such as but not limited to $Al_zGa_{1-z}N$, $Al_wIn_{1-w}N$, or AlN, where Z ranges from 0.2-0.3 and W ranges from 0.7-0.85. In an embodiment, the first polarization charge inducing layer 112 has a thickness greater than a minimum thickness needed to induce a sufficient polarization difference to create 2 DEG effect in the uppermost portion of the group III-N semiconductor material 106. In one such embodiment, the first polarization charge inducing layer 112 has a thickness that is approximately in the range of 3-20 nm. In an embodiment, the first polarization charge inducing layer 112 is AlGaN and the group III-N semiconductor material 106 is GaN. In one such embodiment, the AlGaN polarization charge inducing layer 112 has a thickness that is approximately in the range of 3 nm-5 nm. In an embodiment, the second polarization charge inducing layer 142 is a material with characteristics and thickness that is substantially similar to the material and thickness of the first polarization charge inducing layer 112.

In an embodiment, first doped drain structure 108 and the second doped drain structure 138 include a group III-N semiconductor material such as but not limited to GaN or InGaN. In an embodiment, the first doped drain structure 108 and the second doped drain structure 138 include a dopant that is an n-type dopant such as Si or Ge. In one such embodiment, the n-type dopant material is silicon. In an embodiment, the first doped drain structure 108 and the second doped drain structure 138 have an n-dopant density of at least 1e18/cm$^3$. In an embodiment, the first doped drain structure 108 and the second doped drain structure 138 have a thickness that is approximately in the range of 100-200 nm. In an embodiment, the first doped drain structure 108 and the second doped drain structure 138 have a width that is in the range of 0.8 microns-2.8 microns. In an embodiment, a combination of the height and width of the first doped drain structure 108 or the second doped drain structure 138 and the n-type dopant density are chosen to have a contact resistance of 175 ohms-micrometer to realize a transistor drive current of at least 1 mA/um. In an embodiment, each of the first doped drain structure 108 and the second doped drain structure 138 has a contact resistance value that is less than 175 ohms-micrometer.

In an embodiment, the first doped source structure 110 and the second doped source structure 140 have a material characteristic substantially similar to the first doped drain structure 108 and the second doped drain structure 138, respectively. In an embodiment, the height of the first doped source structure 110 and the second doped source structure 140 is limited by the thickness of the first dielectric layer 127. In an embodiment, the doped source structure 110 and the second doped source structure 140 each have a width that is limited by the size of lateral openings 111 and 141, respectively and to a lesser extent on the height of the first dielectric layer 127.

In an embodiment, the first and second drain contacts 122 and 152, respectively and the first and second gate contacts 126 and 156, respectively, each include a metal such as but not limited to Ti, Al or Ni. In another embodiment, the first and second drain contacts 122 and 152, respectively and the first and second gate contacts 126 and 156, respectively, include a multi-layer stack formed from two or more distinct layers of metal. In other embodiments, the multi-layer stack includes a conductive cap. In one such embodiment, the conductive cap includes a conductive material such as but not limited to tungsten or TiN.

FIGS. 2-18 illustrate cross-sectional views and plan views representing various operations in a method of fabricating a first stack 101 and the second stack 102 of group III-N transistors for an RF switch structure in accordance with embodiments of the present invention.

Figure 2:
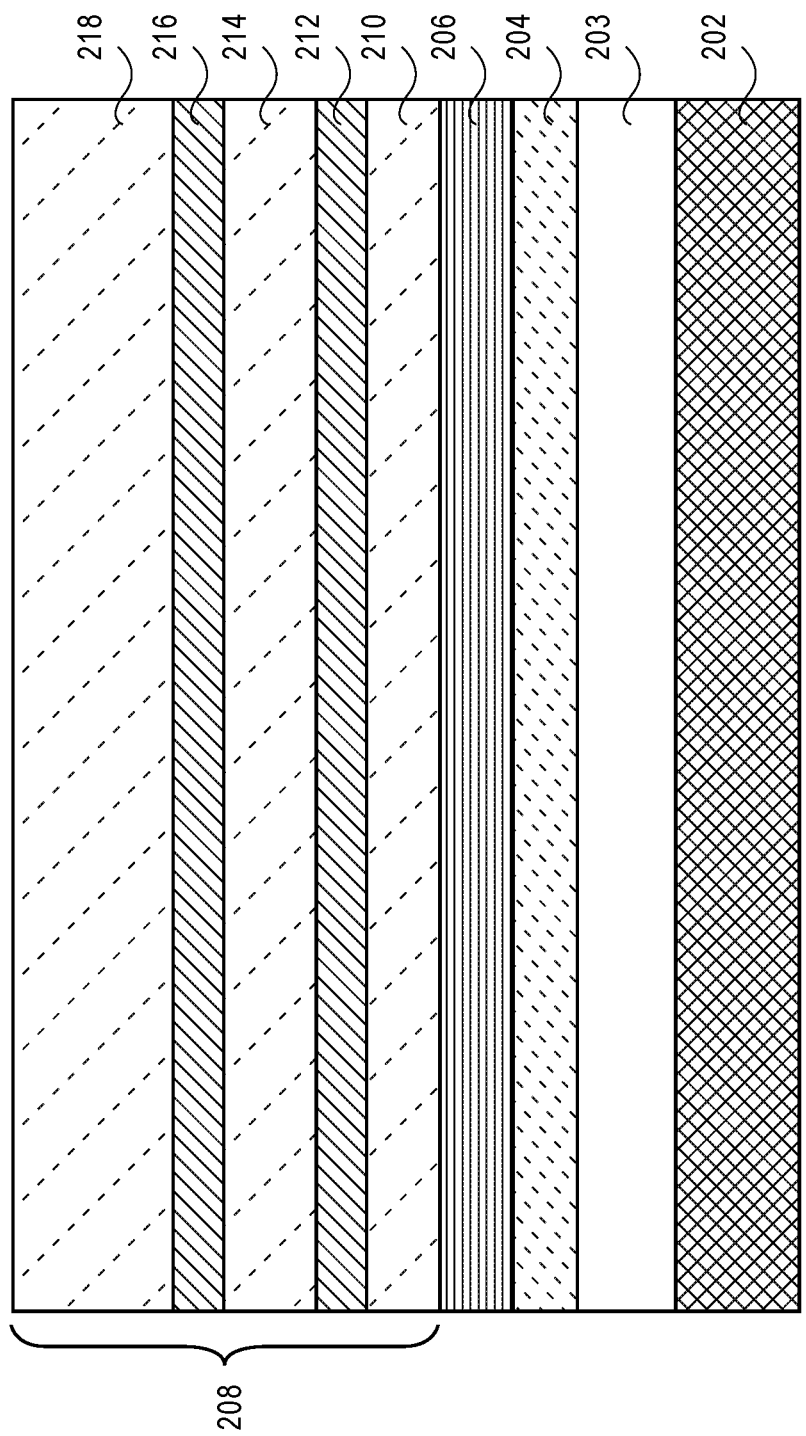
FIGS. 2-18 illustrate cross-sectional views and plan views representing various operations in a method of fabricating a first stack and a second stack of group III-N transistors for RF switches in accordance with embodiments of the present invention.

FIG. 2 illustrates the formation of a multilayer stack 208 on a dielectric layer 206 above a substrate 202. The dielectric layer 206 is formed on a source metal layer 204. The source metal layer 204 is formed on an isolation layer 203 formed above a substrate 202. In an embodiment, the substrate 202 includes a semiconductor material such as but not limited to silicon, silicon germanium (Ge) or silicon carbide (SiC). In an embodiment, the substrate 202 is silicon.

The multilayer stack 208 includes alternating layers of ILD 210, 214, 218 and gate electrode material 212, 216. In an embodiment, there are two layers of gate electrode 212, 216. The number of layers of gate electrode material 212, 216 ultimately reflects the number of gates in the first stack 101 of group III-N transistors described above. In an embodiment, the thickness of the gate electrode material 212, 216 determines (a) the gate length ($L_g$) and (b) partially determines the total resistance of the resistive gate electrodes to be subsequently formed. In an embodiment, the thickness of the gate electrode material ranges from 30 nm-250 nm. In an embodiment the thickness of each layer of gate electrode material 212 and 216 are similar. The thickness of the ILD 210 reflects the gate to source separation. The thickness of the ILD 214 determines the gate to gate separation and the thickness of the ILD 218 determines the gate to drain separation. In an embodiment the thickness of the ILD 210, 214 and 218 are similar. In an embodiment, ILD 210 is thinner than ILD 218. In another embodiment, the thickness of the ILD 218 is sufficiently thick to accommodate downstream process operations as well as maintain a minimum thickness to prevent gate to drain breakdown, $V_{BD}$. In an embodiment, the minimum thickness of the ILD 210 and 214 is 100 nm.

In an embodiment, the ILD 210, 214, 218 includes a material such as but not limited to silicon dioxide, silicon carbide or carbon-doped silicon oxide. In an embodiment, the layers of fin 210, 214, 218 are deposited using a plasma enhanced chemical vapor deposition (PEVCD) or a chemical vapor deposition (CVD) tool.

In an embodiment, the layers of gate electrode material 212, 216 include a metal alloy such as TiN or TaN. In an embodiment, the gate electrode material 212, 216 is chosen for its electrical properties (having work function of at least 4.2 eV and a resistance of at least 30 micro ohm-meter). In an embodiment, the gate electrode material 212, 216 is TiN and chosen for having a work function of at least 4.2 eV as well as for patterning purposes. In an embodiment, gate electrode material 212, 216 is deposited using a physical vapor deposition (PVD) tool.

In an embodiment, isolation layer 203 includes a material or materials such as, but not limited to silicon dioxide ($SiO_2$), carbon doped oxide (CDO) or silicon nitride. In an embodiment, the isolation layer 203 has a thickness that ranges from 100-150 nm. In an embodiment, the source metal layer 204 is a metal such as, but not limited to, W or Ru, or a conductive alloy such as, but not limited to, TiN or TaN. In an embodiment, the source metal layer 204 has a thickness that ranges from 100-200 nm.

Figure 3:
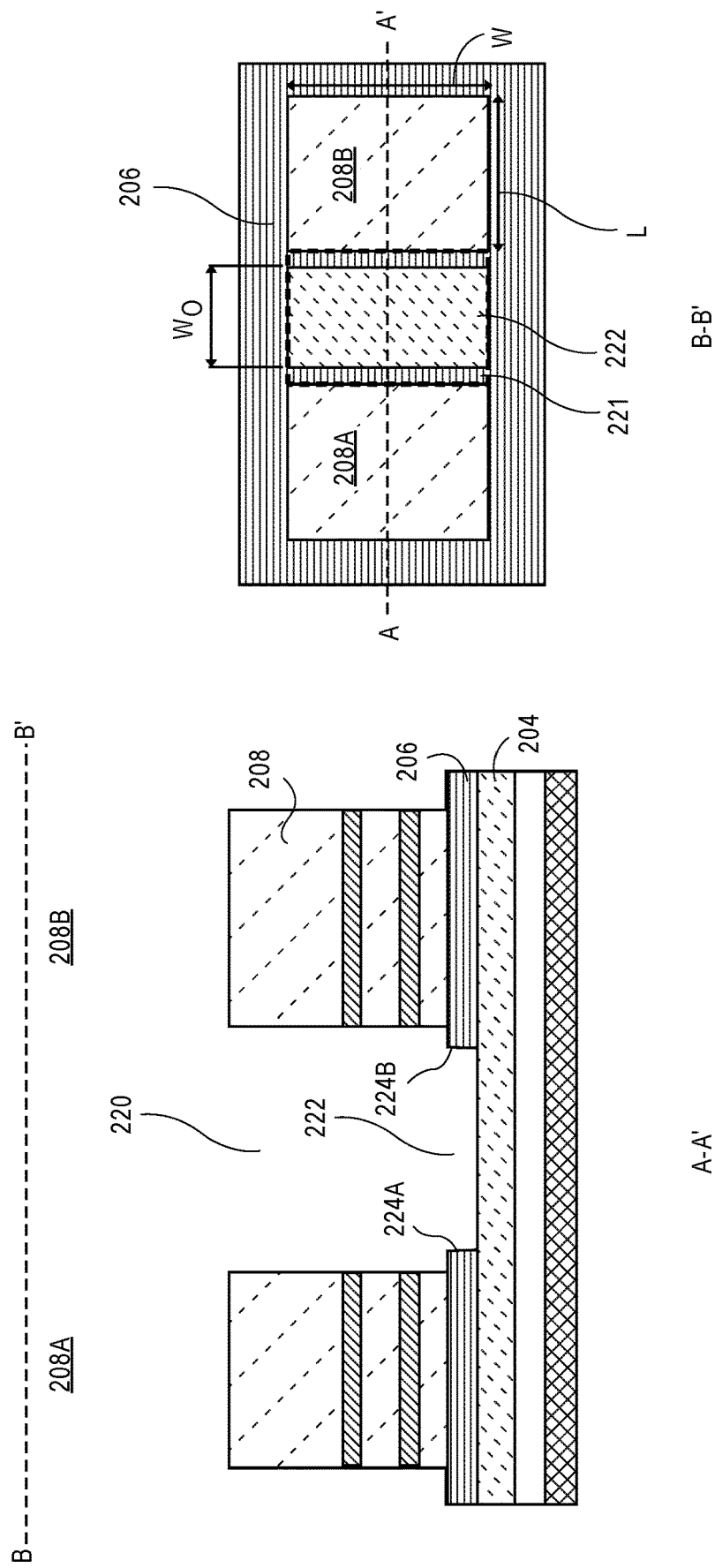

FIG. 3 illustrates the structure of FIG. 2 following patterning of the multi-layer stack 208 to create a first patterned multilayer stack 208A and a second patterned multilayer stack 208B. In an embodiment, the multilayer stack 208 is lithographically patterned and plasma etched to form a first material layer stack 208A, a second material layer stack 208B. A region 220 is formed between the patterned first material layer stack 208A and the second patterned material layer stack 208B. An opening 222 is subsequently formed in the dielectric layer 206, in a portion of the region 220 and exposes the source metal layer 204. In an embodiment, the opening 222 is formed by processes involving masking and plasma etching. The opening 222 forms a step 224A in the dielectric layer 206 adjacent to the first material layer stack 208A and a step 224B in the dielectric layer 206 adjacent to the second material layer stack 208B. The steps 224A and 224B are formed to influence the shape of a group III-N semiconductor material to be subsequently formed in a later operation.

FIG. 3 (B-B') provides a plan view perspective (B-B') of the cross-sectional illustration of FIG. 3 (A-A'). FIG. 3 (B-B') illustrates the relative spacing between first material layer stack 208A and the second material layer stack 208B, the outline of the region 220 (indicated by dashed line 221), and the size of the opening 222. In an embodiment, the first material layer stack 208A and the second material layer stack 208B have a length (L) that ranges from 15-20 micron and a width (W) that ranges from 10-15 micron. The opening 222 has a width chosen to be sufficiently large to enable defect free formation of a group III-N semiconductor material. In an embodiment, the opening 222 has a width, $W_o$, that ranges from 2-6 microns.

Figure 4:
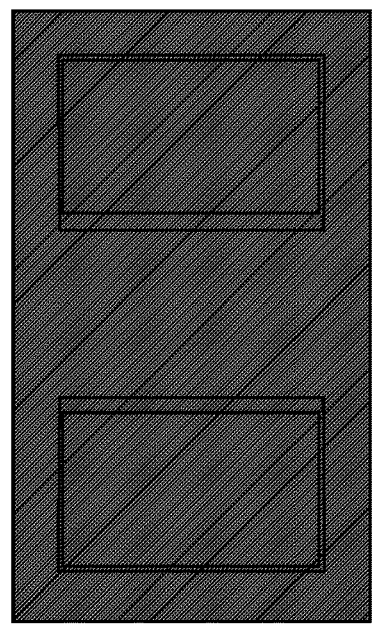
Figure 4:
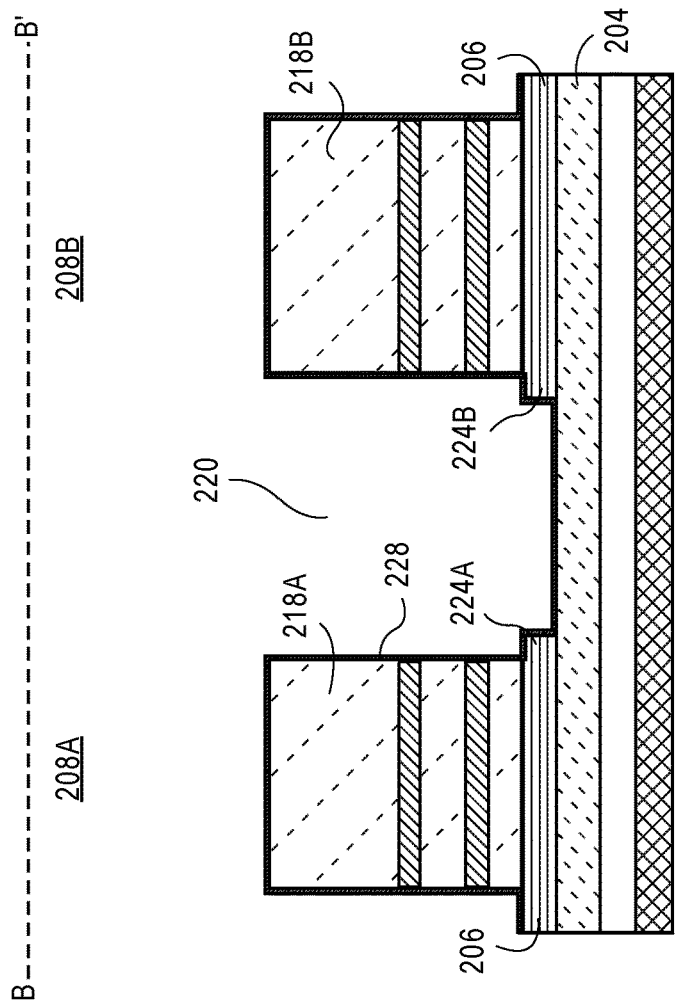

FIG. 4 illustrates cross-sectional and plan views of the structure of FIG. 3 following the formation of a gate dielectric layer 228 in the region 220, on a portion of the surface of the source metal layer 204, on sidewalls and on the uppermost surface of the first and second patterned multilayer stack 208A and 208B, respectively. The gate dielectric layer 228 is also formed on the exposed portions of the dielectric layer 206, including the steps 224A and 224B. In an embodiment, the gate dielectric layer 228 is formed using an atomic layer deposition process. In an embodiment, the gate dielectric layer 228 includes a material such as but not limited to $SiO_2$, SiON, AlN, AlON. In an embodiment, the gate dielectric layers 228 has a thickness that is in the range of 3-10 nm. In an embodiment, to ensure uniform coverage on the sidewalls, the gate dielectric layer is deposited using an atomic layer deposition (ALD) method.

Figure 5:
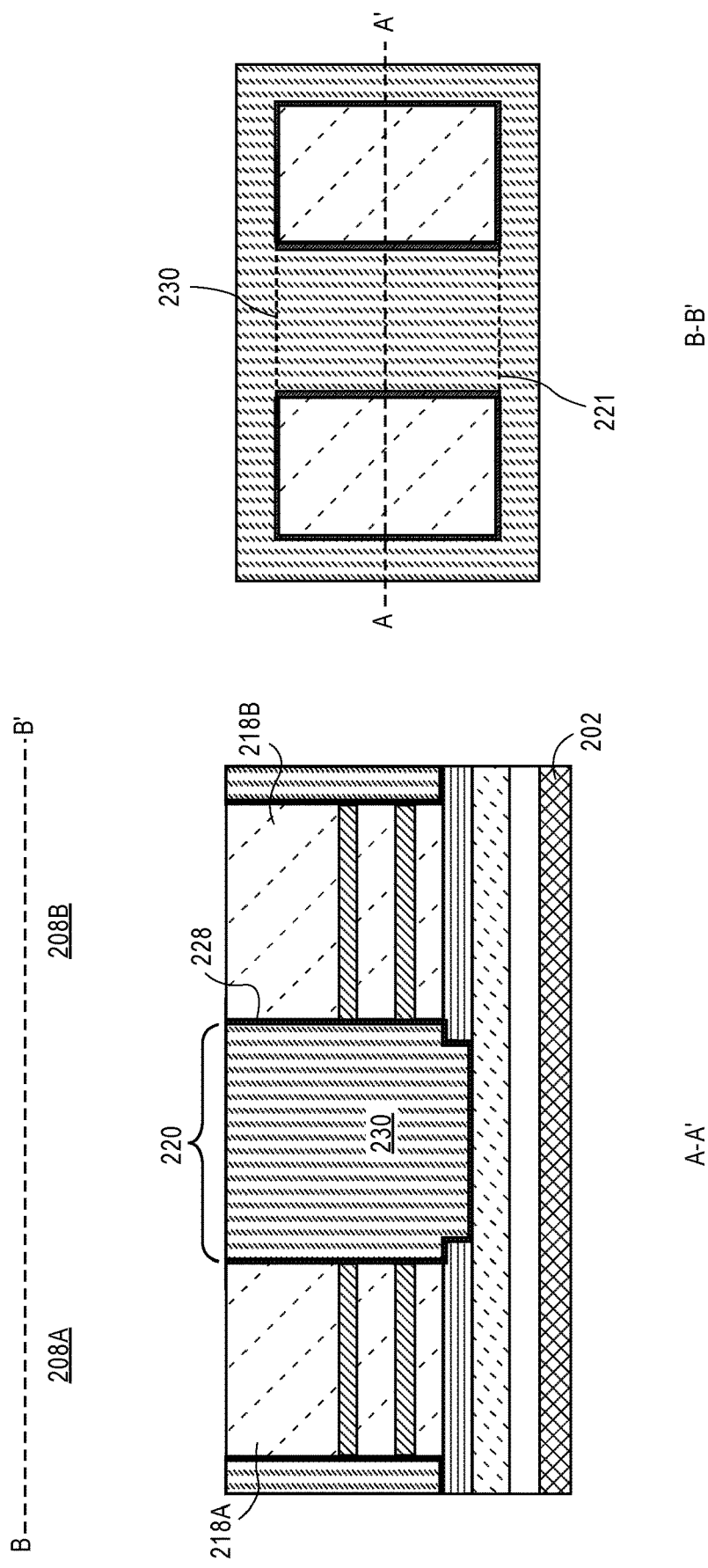

FIG. 5 illustrates the structure of FIG. 4 following the formation of a second dielectric layer 230 in the region 220 between the first and second patterned multilayer stack 208A and 208B, respectively. In an embodiment, the second dielectric layer 230 is blanket deposited using a PECVD, CVD or a PVD process and completely fills the region 220. In an embodiment, the second dielectric layer 230 is a silicon dioxide or a silicon oxynitride film and is capable of being removed using a plasma etch and/or a wet chemical etch.

The second dielectric layer 230 is subsequently planarized. In an embodiment, the planarization process includes a chemical mechanical planarization (CMP) process. In an embodiment, the planarization process removes the deposited dielectric layer 230 from above the first and second patterned multi layer stack 208A and 208B, respectively. In a subsequent polish process, the uppermost portion of the gate dielectric layer 228 is removed from the uppermost surface of the ILD 218A and 218B. In an embodiment, the second dielectric layer 230, the ILD 218A and 218B, and the dielectric layer 228 formed on the sidewalls of the first material layer stack 208A and second material layer stack 208B have uppermost surfaces that are coplanar or substantially coplanar as a result of the CMP process, as illustrated in FIG. 5 (A-A').

FIG. 5 (B-B') illustrates a plan view of the cross-sectional illustration of FIG. 5 (A-A') as observed from the dashed line B-B'. In an embodiment, the second dielectric layer 230 surrounds the first and the second material layer stack 208A and 208B, respectively. The dashed line 221 outlines the boundary of the region 220.

Figure 6:
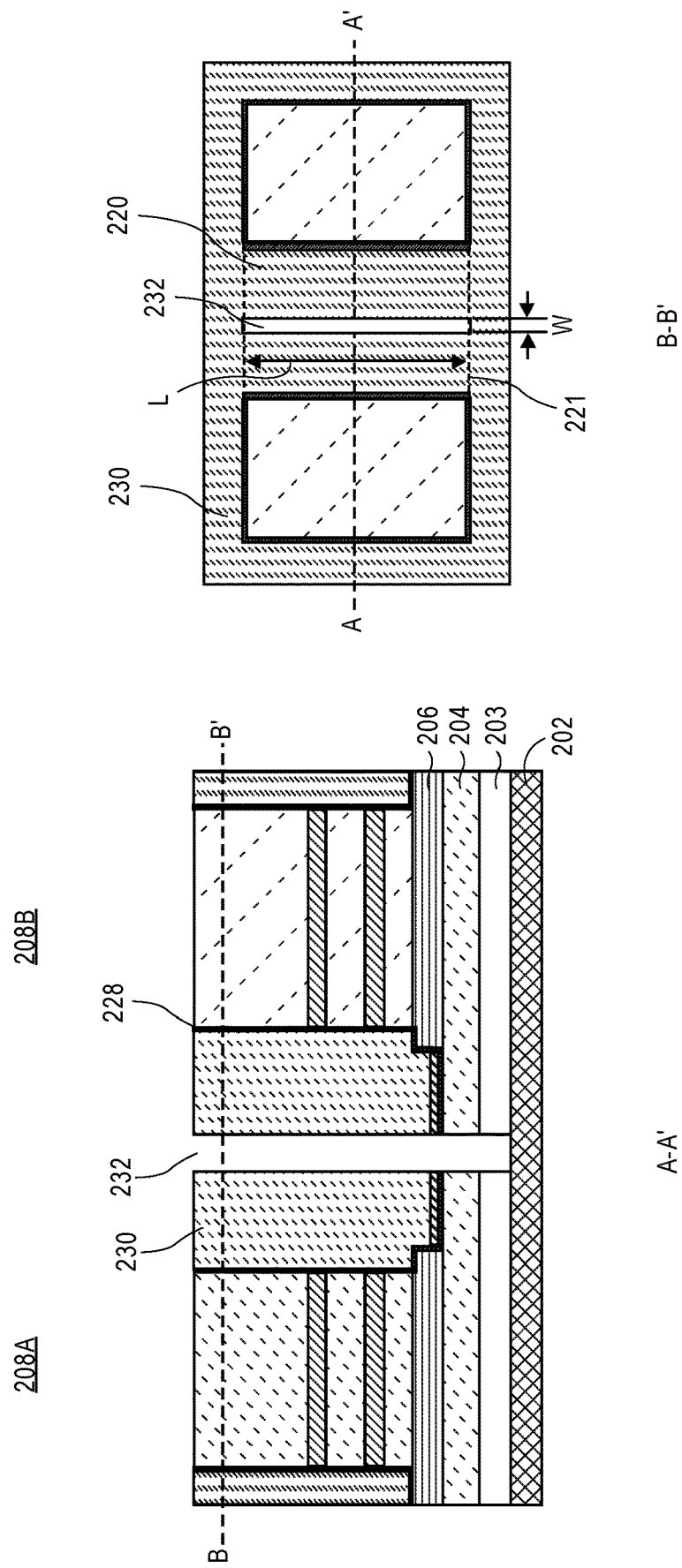

FIG. 6 illustrates the structure of FIG. 5 following the formation of a trench 232 in the second dielectric layer 230, the gate dielectric layer 228, source metal layer 204 and the first dielectric layer 206 to expose the underlying substrate 202. Trench defines a location where a silicon pillar will be formed. In an embodiment, the trench 232 is formed by lithographically exposing a portion of the dielectric layer 230 and by plasma etching. In one such embodiment, the plasma etch process includes multiple process steps to remove portions of the second dielectric layer 230, the gate dielectric layer 228, source metal layer 204, the first dielectric layer 206 and the isolation layer 203 and exposes the (100) uppermost surface of the silicon substrate 202. It is to be appreciated that, in an embodiment, the trench 232 has a profile that is substantially vertical in order to ensure formation of a sufficiently vertical pillar of silicon in a subsequent process operation.

FIG. 6 (B-B') illustrates a plan view cross-section of the cross-sectional illustration of FIG. 6 (A-A') as observed from the dashed line B-B'. FIG. 6 (B-B') illustrates the size and location of the trench 232. The trench 232 is contained within the region 220 (confined by dashed lines 221). In an embodiment, the trench 232, has a width, W, that is in the range of 250-500 nm and a length, L, that is approximately 10-20 microns.

Figure 7:
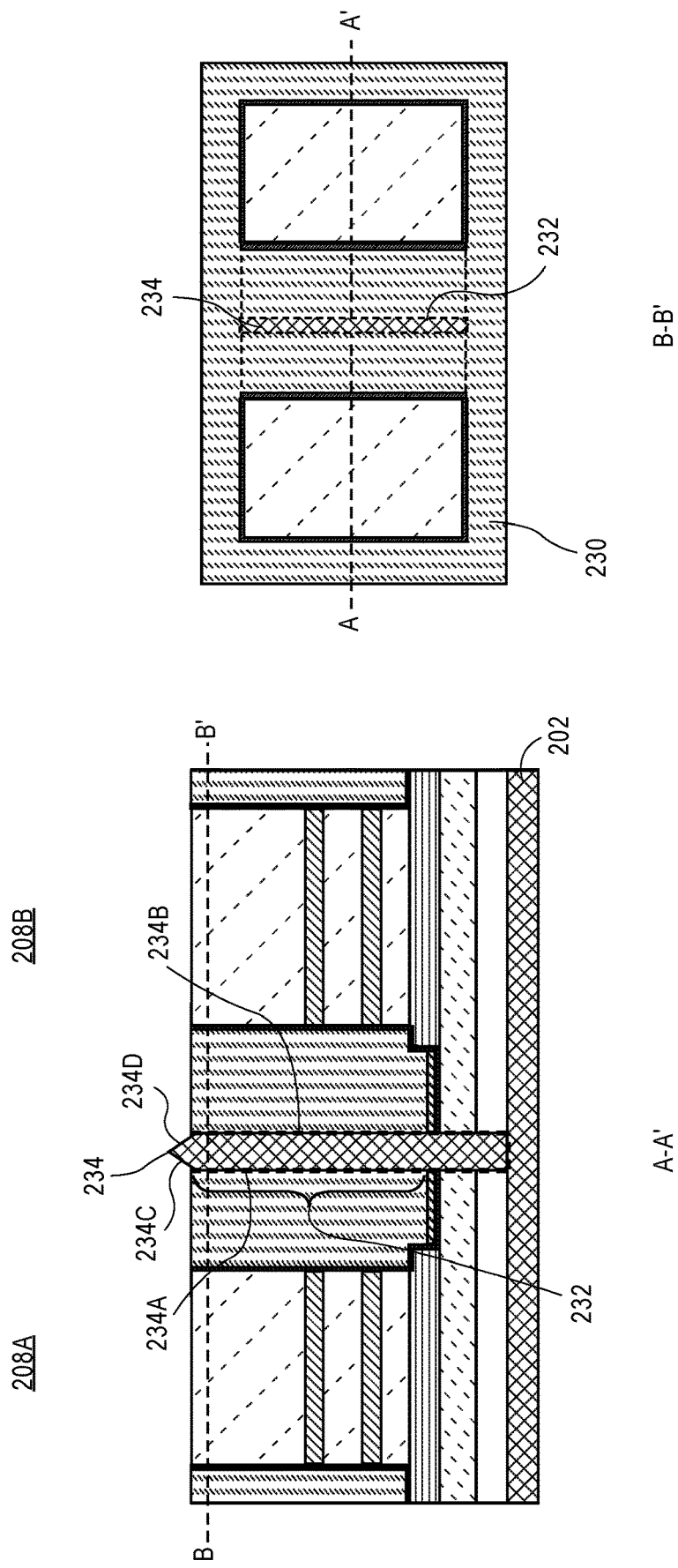

FIG. 7 illustrates the structure of FIG. 6 following the growth of silicon pillar 234 in the trench 232 from the substrate 202. In an embodiment, the silicon pillar 234 is grown epitaxially in a furnace at temperatures in the range of 800-1150 degrees C. In an embodiment, the silicon pillar grows to completely occupy the trench 232 and has sidewalls that are substantially vertical. The silicon pillar 234 has two vertical sidewall portions 234A and 234B, and tapered sidewall portions 234C and 234D that are above the vertical portions 234A and 234B, respectively. In an embodiment, the tapered sidewall portions 234C and 234D meet to form an apex. In other embodiments, the tapered sidewall portions 234C and 234D do not meet but are separated by an uppermost silicon surface that is substantially flat (not shown). In an embodiment, the silicon substrate 202 has a 100 uppermost plane. In one such embodiment, the silicon pillar formed on the 100 surface silicon substrate 202 has sidewalls 234A and 234B, each having a crystal plane with a (110) orientation. In an embodiment, the sidewalls 234A and 234B are chosen to have a 110 crystallographic orientation to influence the crystal plane orientation of the group III-N semiconductor material that will be subsequently formed on the 110 silicon sidewall surfaces 234A and 234B.

FIG. 7 (B-B') illustrates a plan view cross-section of the cross-sectional illustration of FIG. 7(A-A') as observed from the dashed line B-B'. FIG. 7 (B-B') illustrates confinement of the silicon pillar 234 to the trench 232 (denoted by dashed lines).

Figure 8:
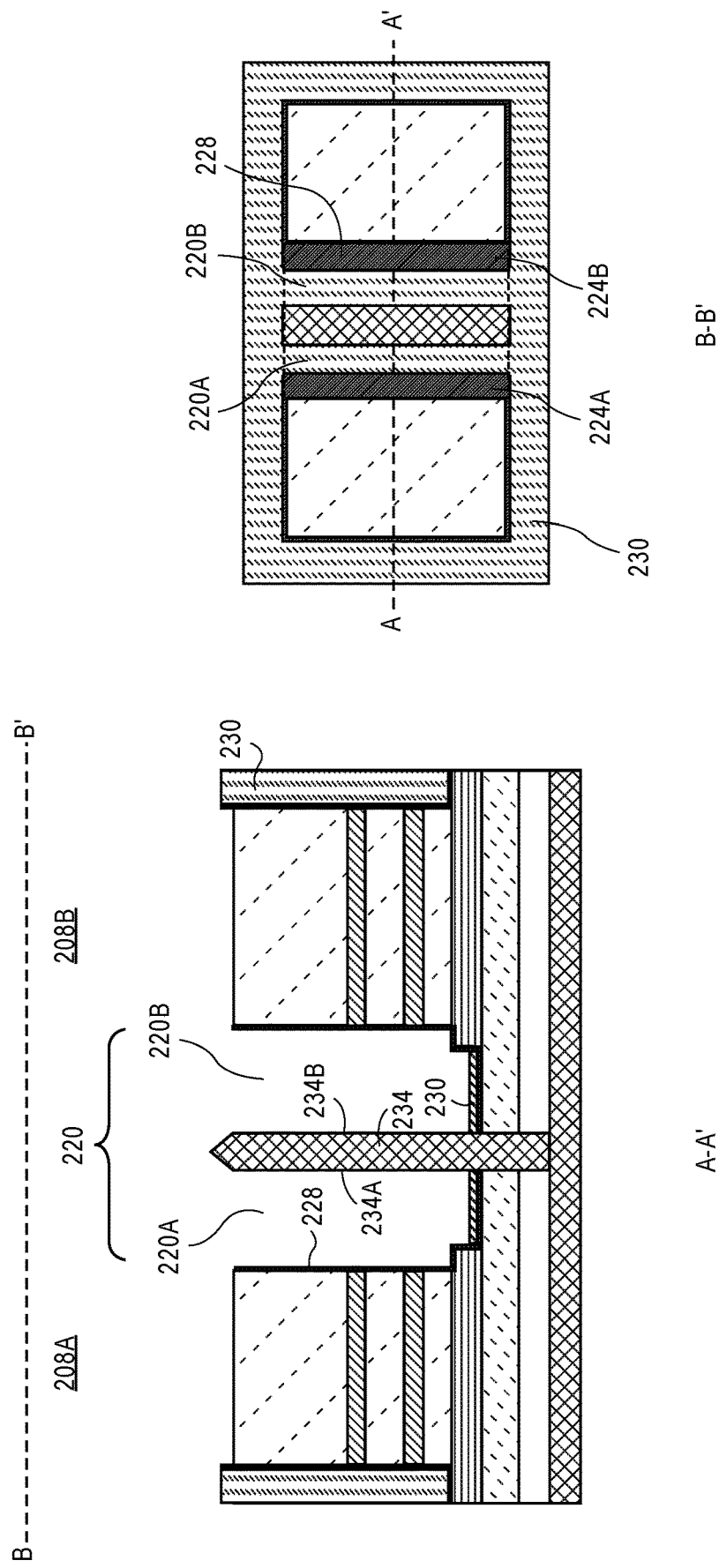

FIG. 8 illustrates cross-sectional and plan views of the structure of FIG. 7 following the removal of the second dielectric layer 230 from the region 220 to expose (a) the vertical sidewalls 234A and 234B of the silicon pillar 234 and (b) portions of the gate dielectric layer 228. In an embodiment, a masking layer is formed on the structure of FIG. 7. In an embodiment, the masking layer exposes the region 220. In an embodiment, the second dielectric layer 230 in the exposed region 220 is plasma etched selectively to the silicon pillar 234. In an embodiment, removal of the second dielectric layer 230 from the region 220 leads to the formation of two regions 220A and 220B separated by the silicon pillar 234.

In an embodiment, while removing the second dielectric layer 230 from the region 220, sidewall spacers are formed on the silicon sidewalls 234A and 234B and adjacent to the gate dielectric layer 228. In an embodiment, the sidewall spacers of the second dielectric layer 230 are subsequently removed, by a wet etch process, exposing the sidewalls of the silicon pillar 234 and the gate dielectric layer 228. It is to be appreciated that the wet etch process is more suitable for removal of the sidewall spacers as compared to a plasma etch process. A plasma etch process possesses an isotropic ion bombardment component which can lead to damage of the silicon sidewalls 234A and 234B and damage of the gate dielectric layer 228. In an embodiment, a portion of the second dielectric layer 230 remains on the bottom surface of the region 220 after the sidewall spacers are removed. In an embodiment, the profile of the portion of the second dielectric layer 230 in the regions 220A and 220B have a concave shape as a result of the wet etch process. In an embodiment, the wet etch process that removes the sidewall spacers includes a mixture containing dilute hydrofluoric (HF) acid, water and nitric acid ($HNO_3$). FIG. 8 (B-B') illustrates the exposure of the gate dielectric layer 228 on the steps 224A and 224B.

Figure 9:
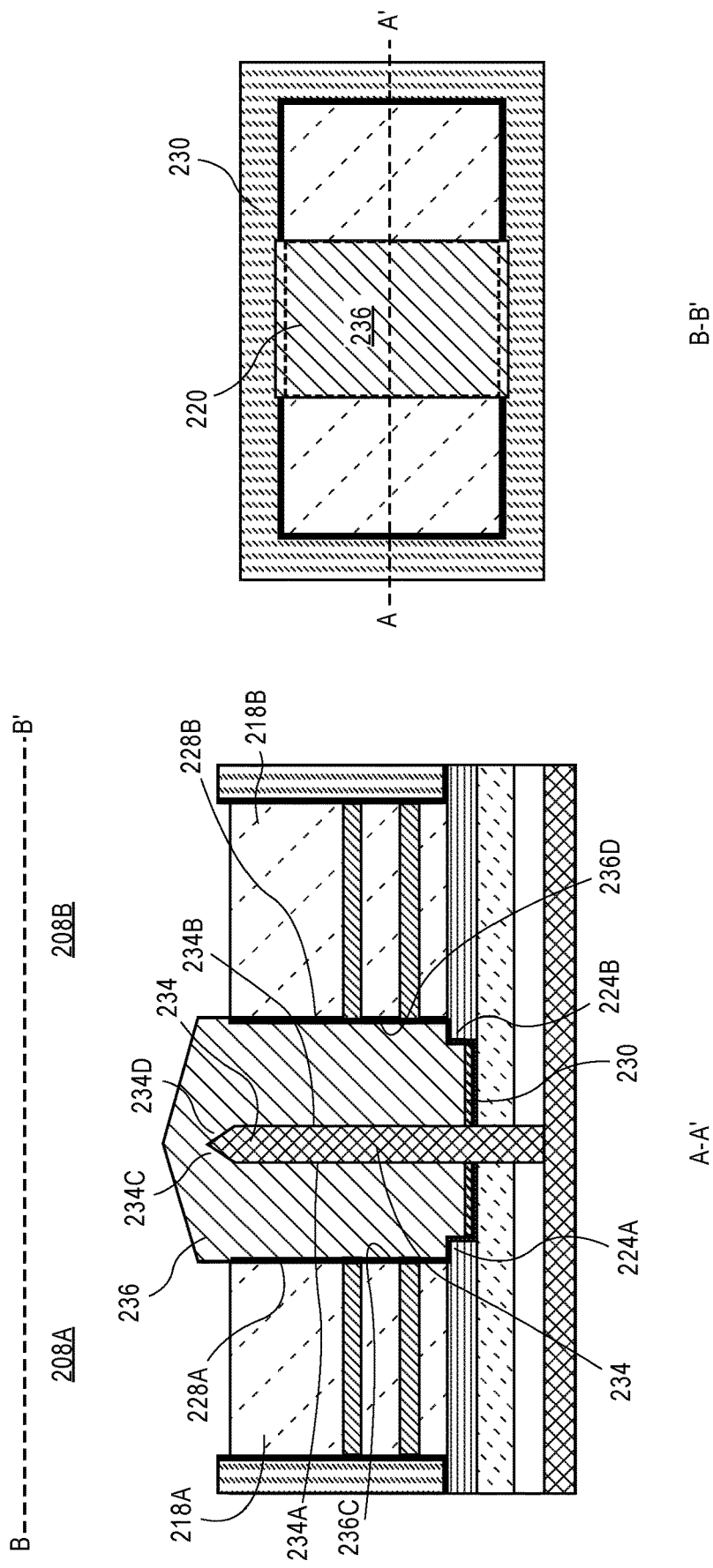

FIG. 9 illustrates the structure of FIG. 8 following the growth of a group semiconductor material 236 on the silicon pillar 234. The group III-N semiconductor material 236 is grown on all exposed sidewalls 234A, 234B, 234C and 234D of the silicon pillar 234 and completely fills the regions 220A and 220B. A portion of the group III-N semiconductor material 236 also grows out of the regions 220A and 220B and over the ILD layers 218A and 218B gate dielectric layer 228. In an embodiment, the group III-N semiconductor material 236 has a portion that grows adjacent to the gate dielectric layer 228A formed on the sidewall of the first material layer stack 208A. Similarly, in an embodiment, the group III-N semiconductor material 236 has a portion that grows adjacent to the gate dielectric layer 228B formed on the sidewall of the second material layer stack 208B as illustrated in FIG. 9 (A-A'), The bottom portions of the group III-N semiconductor material 236 is formed on portions of the second dielectric layer 230 in the regions 220A and 220B respectively. In an embodiment, the steps 224A and 224B lead to the formation of recesses on the sidewalls 236C and 236D of the group III-N semiconductor material 236.

FIG. 9 (B-B') provides a plan view perspective (B-B') of the cross-sectional illustration of FIG. 9 (A-A') and highlights the overlap of the group III-N semiconductor material 236 with the second dielectric layer 230 outside the region 220.

In an embodiment, group III-N semiconductor material 236 is formed using a metal organic chemical vapor deposition (MOCVD) process. In an embodiment, the group III-N semiconductor material 236 is grown by a MOCVD process at a temperature in the range of 900-1100 degrees Celsius. In an embodiment, the group III-N semiconductor material 236 is a material, such as is described above in connection with group III-N semiconductor material 106.

Figure 10:
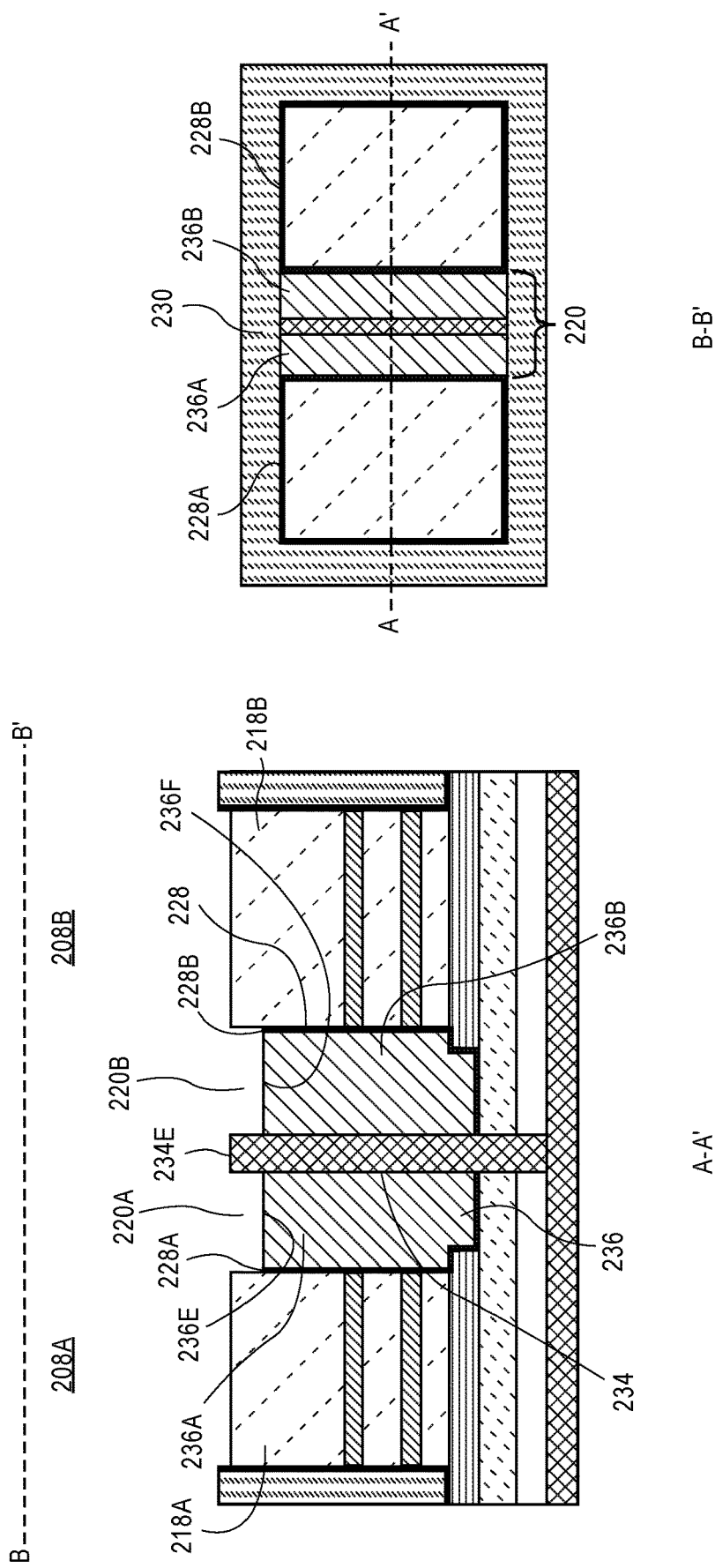

FIG. 10 illustrates the structure of FIG. 9 following a process to planarize the group III-N semiconductor material 236 and portions of the silicon pillar 234 and recess the group III-N semiconductor material 236. In an embodiment, the group III-N semiconductor material 236 is planarized using a polish process. In an embodiment, the polish process is carried out using a chemical mechanical polish. In one such embodiment, portions of the group III-N semiconductor material 236 and portions of the silicon pillar 234 are polished in a first portion of the planarization process to expose the silicon pillar. A subsequent, second planarization process planarizes portions of the group III-N semiconductor material 236, the silicon pillar 234, the gate dielectric layers 228A and 228B, the ILD layers 218A and 218B and the second dielectric layer 230. In one such embodiment, the group III-N semiconductor material 236, silicon pillar 234, the gate dielectric layers 228A and 228B, the ILD layers 218A and 218B and the second dielectric layer 230 have uppermost surfaces that are co-planar or substantially coplanar after the CMP process. The tapered sidewalls 234C and 234D of the silicon pillar are removed during the CMP process leaving a flat uppermost portion 234E. The planarization process separates the group III-N semiconductor material 236 into a first group III-N semiconductor material 236A in the region 220A and a second group III-N semiconductor material 236B in the region 220B.

In an embodiment, after the planarization process, the uppermost surface 234E of the silicon pillar 234 is oxidized. In an embodiment, the oxidation is performed by a plasma oxidation process. Subsequently, in an embodiment, the uppermost surface 236E of the first group III-N semiconductor material 236A and the uppermost surface 236F of the second group III-N semiconductor material 236B are recessed below the level of the uppermost surface 234E of the silicon pillar 234 by a plasma etch process. In an embodiment, the plasma etch process is selective to the silicon pillar 234 and the ILD layers 218A and 218B. In an embodiment, the gate dielectric layers 228A and 228B are also recessed below an upper most surface of the ILD 218A and 218B, respectively as illustrated in FIG. 10 (A-A').

FIG. 10 (B-B') provides a plan view perspective (B-B') of the cross-sectional illustration of FIG. 10 (A-A'). FIG. 10 (B-B') illustrates the confinement of the group III-N semiconductor material 236 within the region 220.

Figure 11:
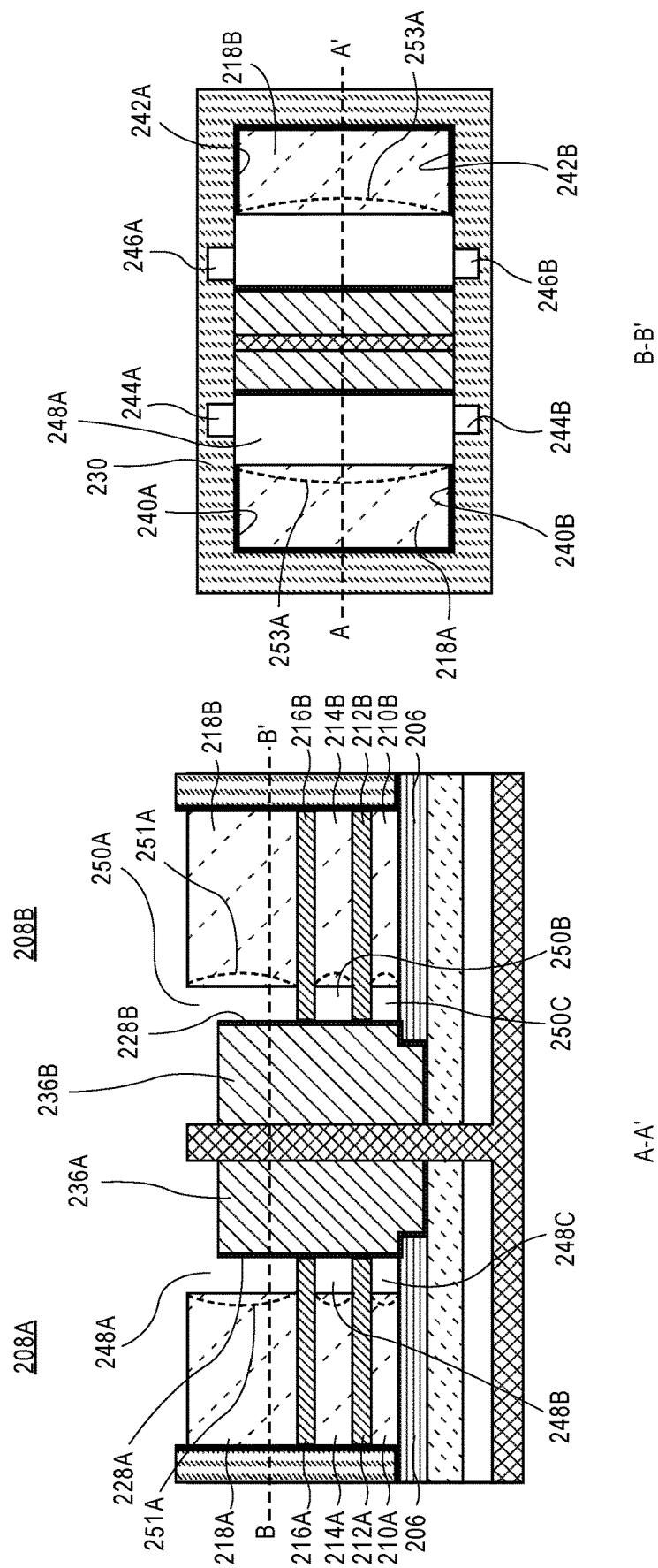

FIG. 11 illustrates the structure of FIG. 10 following the removal of a portion of the ILD layers 210A, 214A, 218A adjacent to the gate dielectric layer 228A from the material layer stack 208A and removal of a portion of the ILD layers 210B, 214B, 218B adjacent to the gate dielectric layer 228B from the material layer stack 208B. In an embodiment, vertical openings 244A, 244B, 246A and 246B are formed in the dielectric layer 230 adjacent to the material layer stack 208A and 208B respectively as illustrated in plan view FIG. 11 (B-B'). In an embodiment, vertical openings 244A, 244B, 246A and 246B are formed by a plasma etch process. In an embodiment, the openings 244A and 244B expose portions of the gate dielectric layer 228A formed on sidewalls 240A and 240B, respectively. In an embodiment, the openings 244A and 244B also expose portions of uppermost surface of the dielectric layer 206. In an embodiment, the openings 246A and 246B expose portions of the gate dielectric layer 228B formed on sidewalk 242A and 242B. In an embodiment, the openings 246A and 246B also expose portions of uppermost surface of the dielectric layer 206.

In a subsequent operation, the portions of the gate dielectric layer 228A and 228B exposed by vertical openings 244A, 244B, 246A and 246B are removed by a wet etch process. The removal of the portions of the gate dielectric layer 228A exposes portions of the sidewalk 240A and 240B of the first material layer stack 208A. The removal of the portions of the gate dielectric layer 228B exposes portions of the sidewalk 242A and 242B of the second material layer stack 208B.

Referring to the cross-sectional illustration in FIG. 11 (A-A') lateral openings 248A, 248B and 248C are formed in portions of the ILD 210A, 214A, 218A layer adjacent to the openings 244A and 244B after a second subsequent wet etch process. Similarly, openings 250A, 250B and 250C are formed in portions of the ILD 210B, 214B, 218B layer adjacent to the openings 246A and 246B after a second subsequent wet etch process.

In an embodiment, the wet etch process removes portions of the ILD 210A, 214A, 218A selectively to the gate electrodes 212A and 216A and to the gate dielectric layer 228A and to the second dielectric layer 230. In an embodiment, the wet etch process removes portions of the ILD 210B, 214B, 218B selectively to the electrodes 212B and 216B and to the gate dielectric layer 228B and to the second dielectric layer 230.

In an embodiment, the wet etch laterally erodes the ILD 210A, 214A, 218A as indicated by the dashed lines 251A in the cross-sectional illustration in FIG. 11 (A-A'). It is to be appreciated, in an embodiment, all ILD layers 210A, 214A, 210B, 214B and 218B have a lateral undercut 251A similar to the lateral undercut 251A in ILD 218A.

In an embodiment, a lateral undercut in the ILD 218A is illustrated by the dashed line 253A in the cross-section plan view FIG. 11 (B-B'). The lateral undercut is in a direction orthogonal to the undercut 251A in FIG. 11 (A-A'). In an embodiment, that each ILD layer 210A, 214A, 210B, 214B and 218B has a lateral undercut portion 253A similar to the lateral undercut 253A in ILD 218A.

In an embodiment, formation of lateral openings 248A, 248B and 248C expose portions of the dielectric layer 228A adjacent to the first group III-N semiconductor material 236A. Similarly, lateral openings 250A, 250B and 250C expose portions of the dielectric layer 228B adjacent to the first group III-N semiconductor material 236B.

Figure 12:
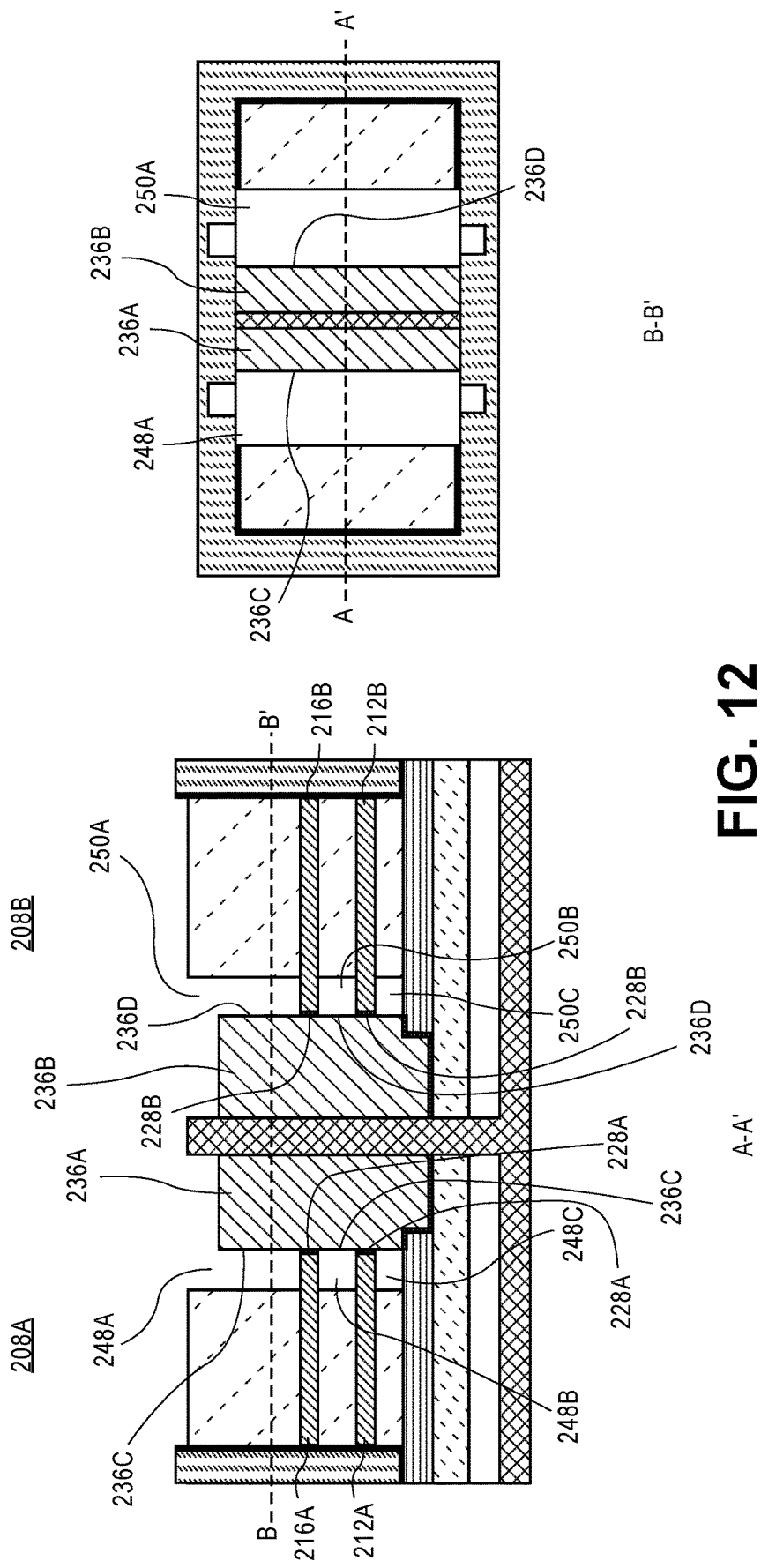

FIG. 12 illustrates the structure of FIG. 11 following the removal of the gate dielectric layer 228A from the openings 248A, 248B and 248C and removal of the gate dielectric layer 228B from the openings 250A, 250B and 250C. Removal of the gate dielectric layers 228A and 228B from opening 248A, 248B and 248C and openings 250A, 250B and 250C, respectively enables growth of a polarization charge inducing layer to be subsequently formed on the group III-N semiconductor material sidewalls 236C and 236D. In an embodiment, a portion of the gate dielectric layer 228A is removed from vertical sidewall 236C of the first group III-N semiconductor material 236A in each of the lateral openings 248A, 248B and 248C as is depicted in cross-sectional illustration in FIG. 12 (A-A'). In one such embodiment, a portion of the gate dielectric layer 228B is removed from vertical sidewall 236D of the first group III-N semiconductor material 236B in each of the lateral openings 250A, 250B and 250C as is depicted in cross-sectional illustration in FIG. 12 (A-A'). In an embodiment, portions of the gate dielectric layer 228A remain between each respective gate electrode layer 212A and 216A and the sidewall 236C and portions of the gate dielectric layer 228B remain between each respective gate electrode layer 212B and 216B and the sidewall 236D. In an embodiment, gate dielectric layer 228A and 228B are removed from the sidewalls 236C and 236D, respectively by a wet etch process that is selective to the gate electrodes 216A, 216B, 212A and 212B, ILD 218A and 218B, and group III-N semiconductor material 236A and 236B.

FIG. 12 (B-B') illustrates a plan view cross-section of the cross-sectional illustration of FIG. 12 (A-A') as observed from the dashed line B-B'. In an embodiment, FIG. 12 (B-B') illustrates the exposure of the sidewall 236C of the first group III-N semiconductor material 236A after removal of the gate dielectric layer 228A from the opening 248A. Similarly, in an embodiment, FIG. 12 (B-B') also illustrates the exposure of the sidewall 236D of second group III-N semiconductor material 236B after removal of the gate dielectric layer 228B from the opening 250A.

Figure 13:
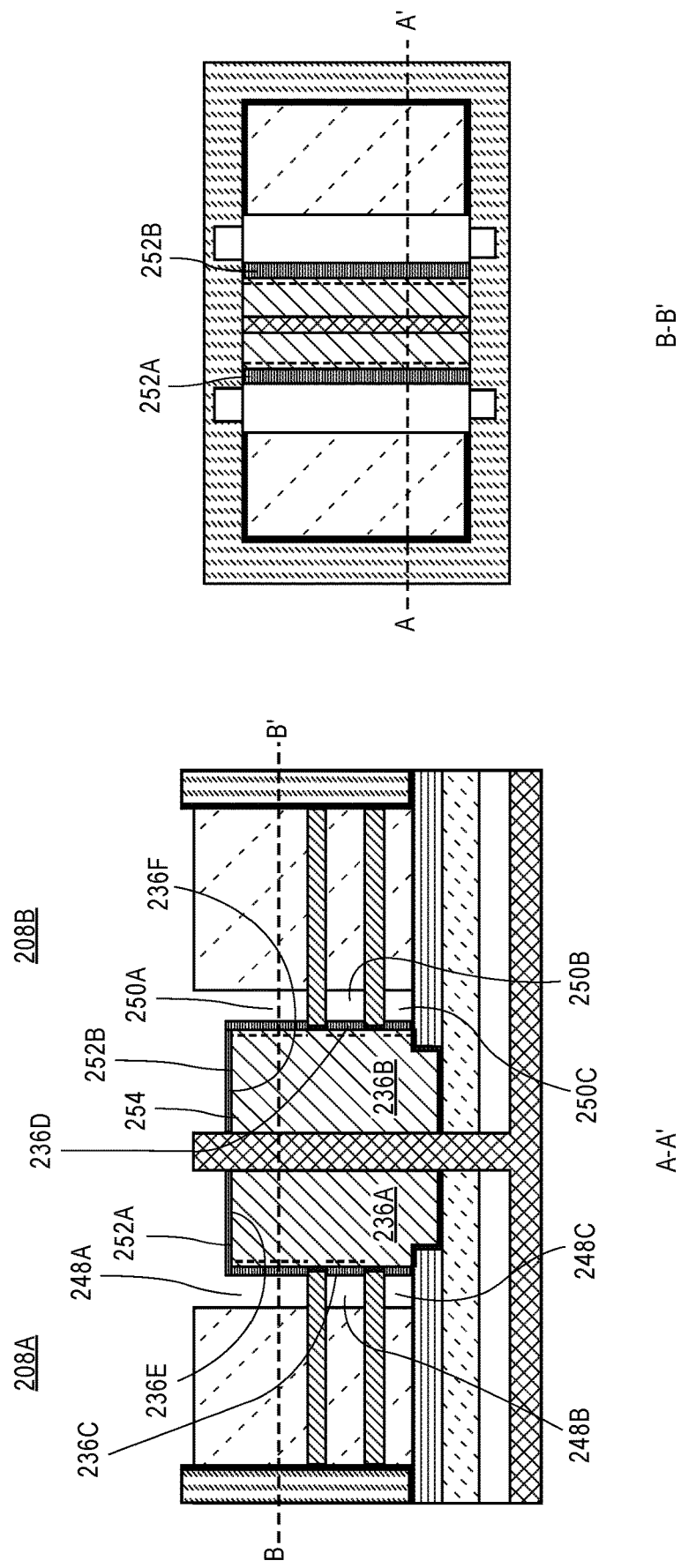

FIG. 13 illustrates the structure of FIG. 12 following the formation of a polarization charge inducing layer 252A on exposed surfaces of the first group III-N semiconductor material 236A in the openings 248A, 248B and 248C and the formation of a polarization charge inducing layer 252B on the exposed surfaces of the second group III-N semiconductor material 236B in the openings 250A, 250B and 250C. In an embodiment, the first polarization charge inducing layer 252A is also formed on the uppermost surface 236E of the first group III-N semiconductor material 236A and the polarization charge inducing layer 252B is also formed on the uppermost surface 236F of the second group 111I-N semiconductor material 236B. In an embodiment, the polarization charge inducing layers 252A and 252B are grown using an MOCVD process. In an embodiment, the polarization charge inducing layer 252A and 252B are grown to a thickness of 3-10 nm. In an embodiment, a polarization charge inducing layer 252A and 252B having a thickness of 3-10 nm is suitable to form 2 DEG.

The formation of a polarization charge inducing layer 252A and 252B leads to the creation of a 2 DEG effect in the surface of the group III-N semiconductor material 236A and 236B, respectively. The 2 DEG effect is limited to the region where the polarization charge inducing layer 252A and 252B makes contact with the group III-N semiconductor material 236A and 236B, respectively.

Figure 14:
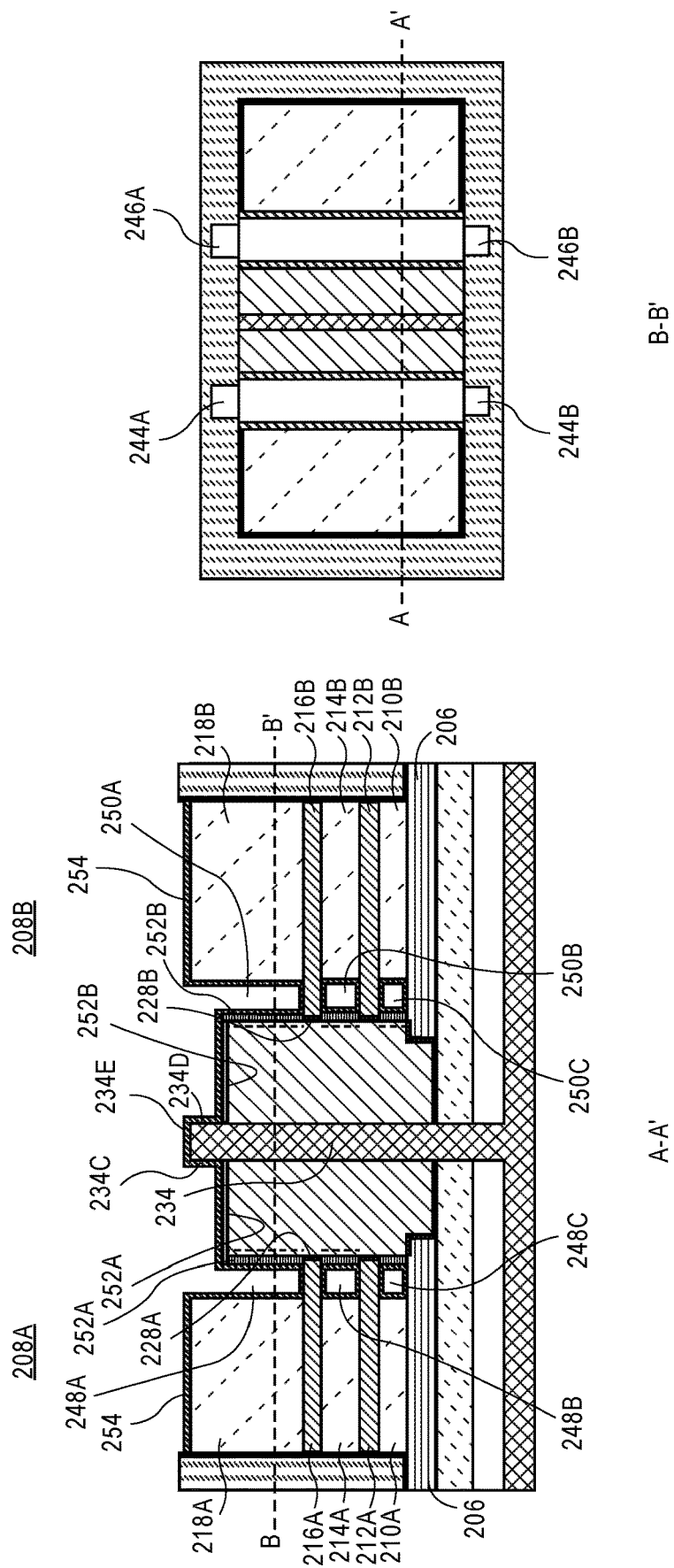

FIG. 14 illustrates the structure of FIG. 13 following the formation of a high K dielectric layer 254 in the openings 248A, 248B, 248C, 250A, 250B and 250C. The formation of the high K dielectric layer 254 enables protection of the exposed polarization charge inducing layer 252A and 252B and the gate dielectric layer 228A and 228B from a subsequent wet etch operation.

In an embodiment, the high K dielectric layer 254 is also formed in the opening 248A, on the uppermost surface and on the sidewall of the ILD 218A, on the uppermost surface of the first gate electrode layer 216A and on the polarization charge inducing layer 252A. In an embodiment, the high K dielectric layer 254 is formed in the opening 248B on the sidewall of ILD 214A, on the exposed lowermost surface of the gate electrode layer 216A, on the exposed uppermost surface of second gate electrode layer 212A, and on the polarization layer 252A. In an embodiment, the high K dielectric layer 254 is formed in the opening 248C on the sidewalls of ILD 210A, on exposed lowermost surface of the gate electrode layer 212A, on the uppermost surface of the dielectric layer 206 and on the polarization layer 252A.

In an embodiment, the high K dielectric layer 254 is formed in the opening 250A, on the uppermost surface and on sidewall of the ILD 218B, on the uppermost surface of the gate electrode layer 216B and on the polarization charge inducing layer 252A. In an embodiment, the high K dielectric layer 254 is formed in the opening 250B on the sidewalls of the ILD 214B, on exposed lowermost surface of the gate electrode layer 216B, on the exposed uppermost surface of gate electrode layer 212B, and on the polarization layer 252B. In an embodiment, the high K dielectric layer 254 is formed in the opening 250C on the sidewalk of ILD 210B, on exposed lowermost surface of the gate electrode layer 212B, on the uppermost surface of the dielectric layer 206 and on the polarization layer 252B. In an embodiment, the high K dielectric layer 254 is also formed on the sidewalls 234C and 234D and on the uppermost surface 234E of the silicon pillar 234. The high K dielectric layer 254 is also disposed on the sidewalls of the second dielectric layer 230 exposed by vertical openings 244A, 244B, 246A and 246B as illustrated in the plan view cross-section FIG. 14 (B-B') along the direction B-B' in the cross-sectional illustration of FIG. 12 (A-A').

In an embodiment, the high K dielectric is formed using an ALD process. It is to be appreciated that the functional purpose of the high K layer is to cover and thus prevent damage of the (a) polarization charge inducing layer 252A and 252B, (b) the gate dielectric layers 228A and 228B and (c) the gate electrodes 216A, 216B, 212A and 212B, from subsequent processing. To this effect, in an embodiment, the relative thickness of the high K dielectric layer does not have to be uniform on all sidewalls of the layers exposed by lateral openings 248A, 248B, 246C 250A, 250B and 250C, although that is a byproduct of an ALD process. In an embodiment, the thickness of the high K dielectric layer is in the range of 3-10 nm.

Figure 15:
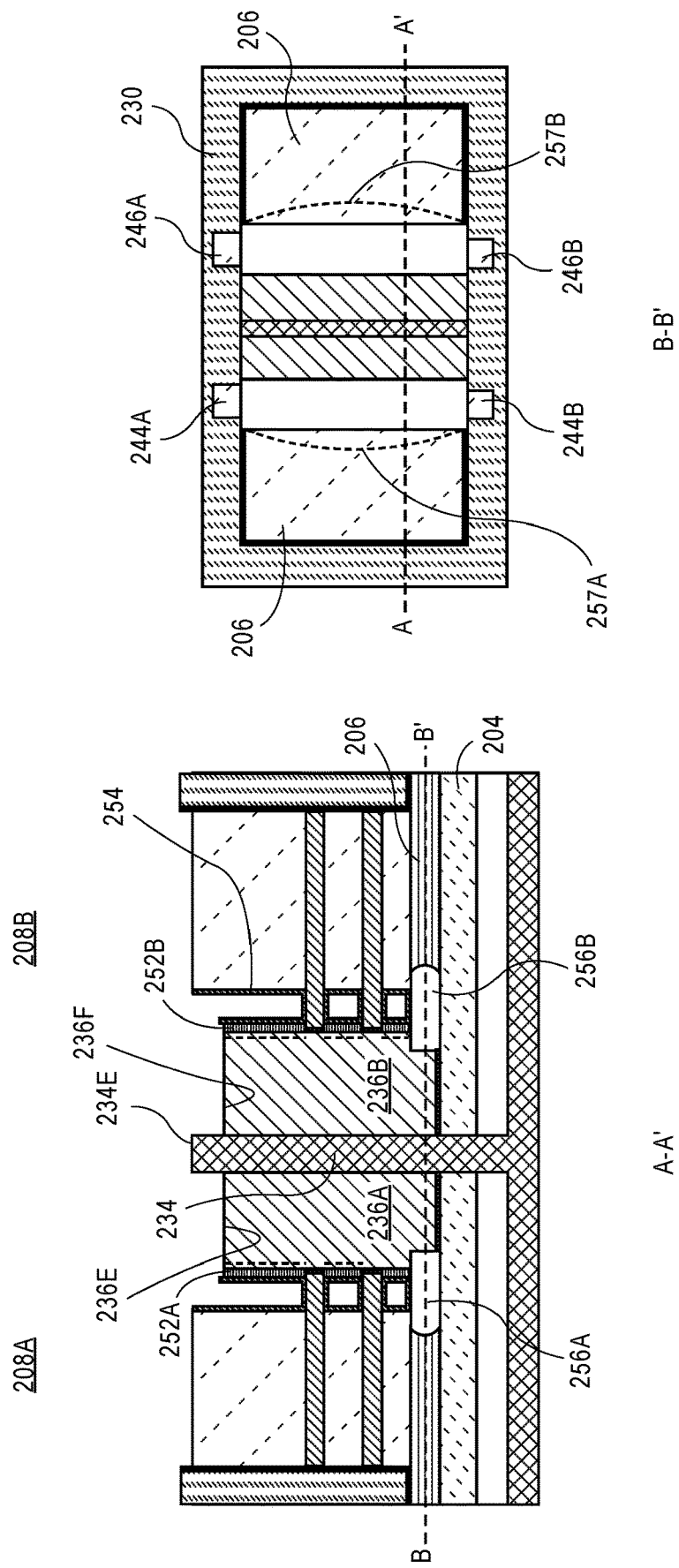

FIG. 15 illustrates the structure of FIG. 14 following the (a) removal of portions of the high K dielectric layer 254 and portions of polarization charge inducing layer 252A and 252B from the uppermost surfaces 236E and 236F of the group III-N semiconductor material 236A and 236B respectively and (b) formation of lateral openings 256A and 256B in portions of the first dielectric layer 206 in the first and in the second material layer stack 208A and 208B, respectively.

The high K dielectric layer 254 and the polarization charge inducing layer 252A and 252B are removed to subsequently form doped drain structures. The high K dielectric layer 254 is removed by a plasma etch process exposing portions of the polarization charge inducing layer 252A and 252B formed above the first group III-N semiconductor material 236A and the second group III-N semiconductor material 236B, respectively. The high K dielectric layer 254 is removed from the upper most surface 234E and from portions of the sidewall of the silicon pillar 234. The high K dielectric layer 254 is also removed from the uppermost surface of the first dielectric layer 206, and from sidewalk of vertical openings 244A, 244B, 246A and 246B formed in the second dielectric layer 230. In an embodiment, portions of the high K dielectric layer 254 are also removed from above the ILD 218A and 218B.

Subsequently, a second plasma etch process is used to remove portions of the polarization charge inducing layer 252A and 252B to expose the uppermost surface 236E of the first group III-N semiconductor material 236A and expose the uppermost surface 236F of the second group III-N semiconductor material 236B.

In one such embodiment, exposed portions of the silicon pillar 234 may be partially consumed by the plasma etch. In an embodiment, the portions of the silicon pillar exposed during removal of the high K dielectric layer 254 may be further reoxidized to form a protective barrier against potential erosion during removal of the polarization charge inducing layer 252A and 252B.

Subsequently after the first dielectric layer 206 is exposed in the vertical openings 244A, 244B, 246A and 246B, lateral openings 256A and 256B are formed in the first dielectric layer 206 by a wet etch process. In an embodiment, the wet etch process selectively removes portions of the dielectric layer 206 under the first group III-N semiconductor material 236A and second group III-N semiconductor material 236B. Formation of lateral openings 256A and 256B result in exposure of portions of the gate dielectric layer 228A and 228B formed on the sidewalls of the recessed portions of the base of each of the first and second group III-N semiconductor material 236A and 236B, respectively. In an embodiment, the gate dielectric layer 228A and 228B are removed from the openings 256A and 256B, respectively. In an embodiment, the formation of the lateral openings 256A and 256B result in the first dielectric layer 206 having a concave profile as is depicted in the cross-sectional illustration (A-A') of FIG. 15.

FIG. 15 (B-B') illustrates a plan view cross-section of the cross-sectional illustration of FIG. 15 (A-A') as observed from the dashed line B-B'. FIG. 15 (B-B') illustrates the formation of a concave profile (indicated by dashed lines 257A and 257B) in the dielectric layer 206 as a result of the wet etch process.

Figure 16:
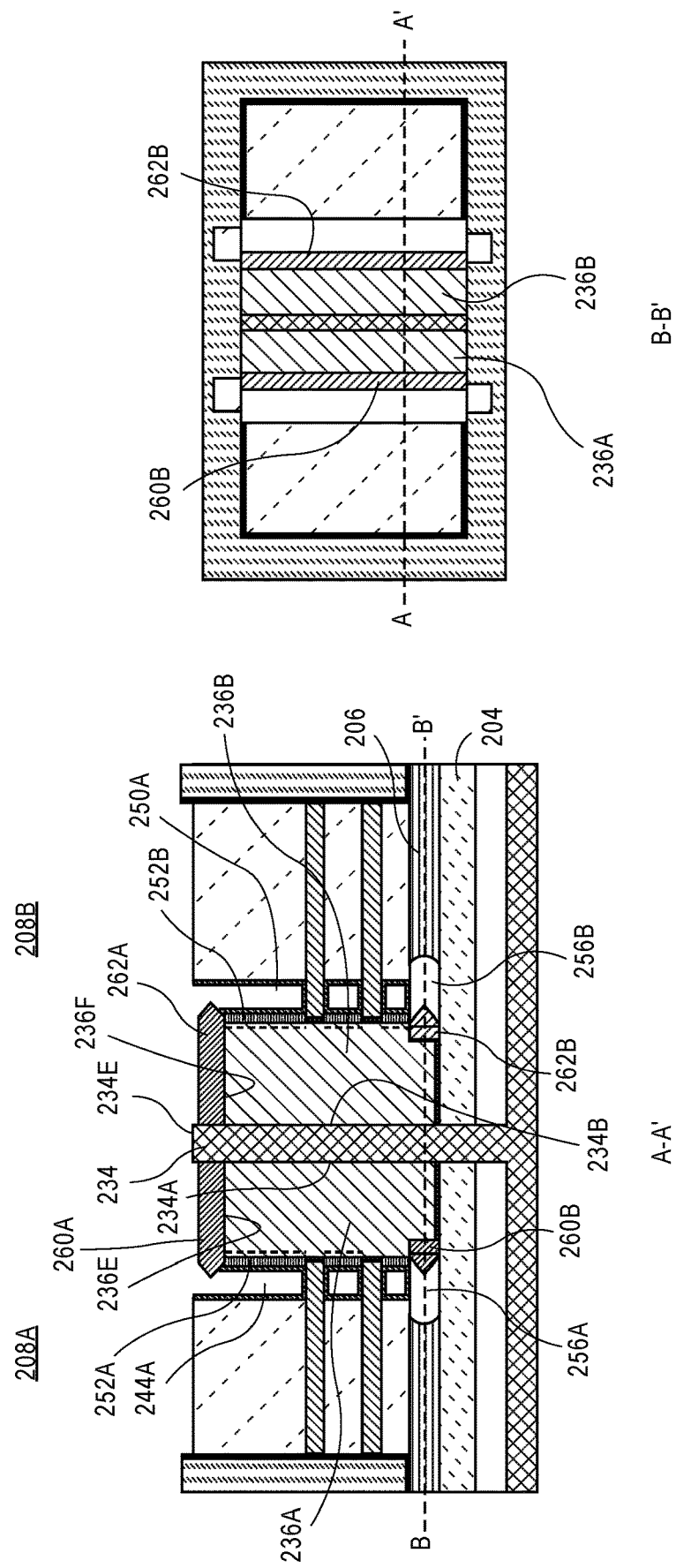

FIG. 16 illustrates the structure of FIG. 15 following the formation of a first doped drain structure 260A on the uppermost surface 236E of the first group III-N semiconductor material 236A, and a first doped source structure 260B formed in the opening 256A on the exposed surface of the first group III-N semiconductor material 236A. FIG. 16 further illustrates the formation of a second doped drain structure 262A on the uppermost surface 236F of the second group III-N semiconductor material 236B and a second doped source structure 262B formed in the opening 256B on the exposed surfaces of the first group III-N semiconductor material 236B.

The first and the second doped drain structures 260A and 262A, respectively are separated from each other by the silicon pillar 234. In an embodiment, the first doped drain structure 260A is grown to contact the sidewall 234A of the silicon pillar 234. Further portions of the first doped drain structure 260A is in contact with and extends over the polarization charge inducing layer 252A in the lateral opening 244A. In one such embodiment, the second doped drain structure 262A is grown to contact the sidewall 234B of the silicon pillar 234. Further portions of the second doped drain structure 262A is in contact with and extends over the polarization charge inducing layer 252B in the lateral opening 246A. In an embodiment, the first and second doped drain structures 260A and 262A have uppermost surfaces that are co-planar with the uppermost surface 234E of the silicon pillar 234. In other embodiments, the first and second doped drain structures 260A and 262A have uppermost surfaces that are above or below the uppermost surface 234E of the silicon pillar 234.

In an embodiment, the growth of the first and second doped source structures 260B and 262B are limited by the height and width of the openings 256A and 256B. The first and second doped source structures 260B and 262B are grown to fill the height of the openings 256A and 256B and are in physical contact with the uppermost surface of the source metal layer 204 exposed by the openings 256A and 256B, respectively. In an embodiment, first and second doped source structures 260B and 262B are continuous along the lateral opening 256A and 256B, respectively. In an embodiment, first and second doped source structures 260B and 262B have a width that is substantially uniform along the sidewall of the first and second group III-N semiconductor material 236A and 236B, respectively as is depicted in the plan view illustration of FIG. 16 (taken along the B-B' line in the cross-sectional illustration of FIG. 16).

It is to be appreciated that the exposed source metal layer 204 in the openings 256A and 256B should be sufficiently free of any residual dielectric layer 206 before formation of the first and second doped source structures 260B and 262B. In an embodiment, residual dielectric layer 206 remaining on the surface of source metal layer 204 can prevent an electrical connection between the first and second source structures 260B and 262B and the source metal layer 204. In an embodiment, degraded electrical connection will serve to increase contact resistance and thereby negatively impact device performance.

Figure 17:
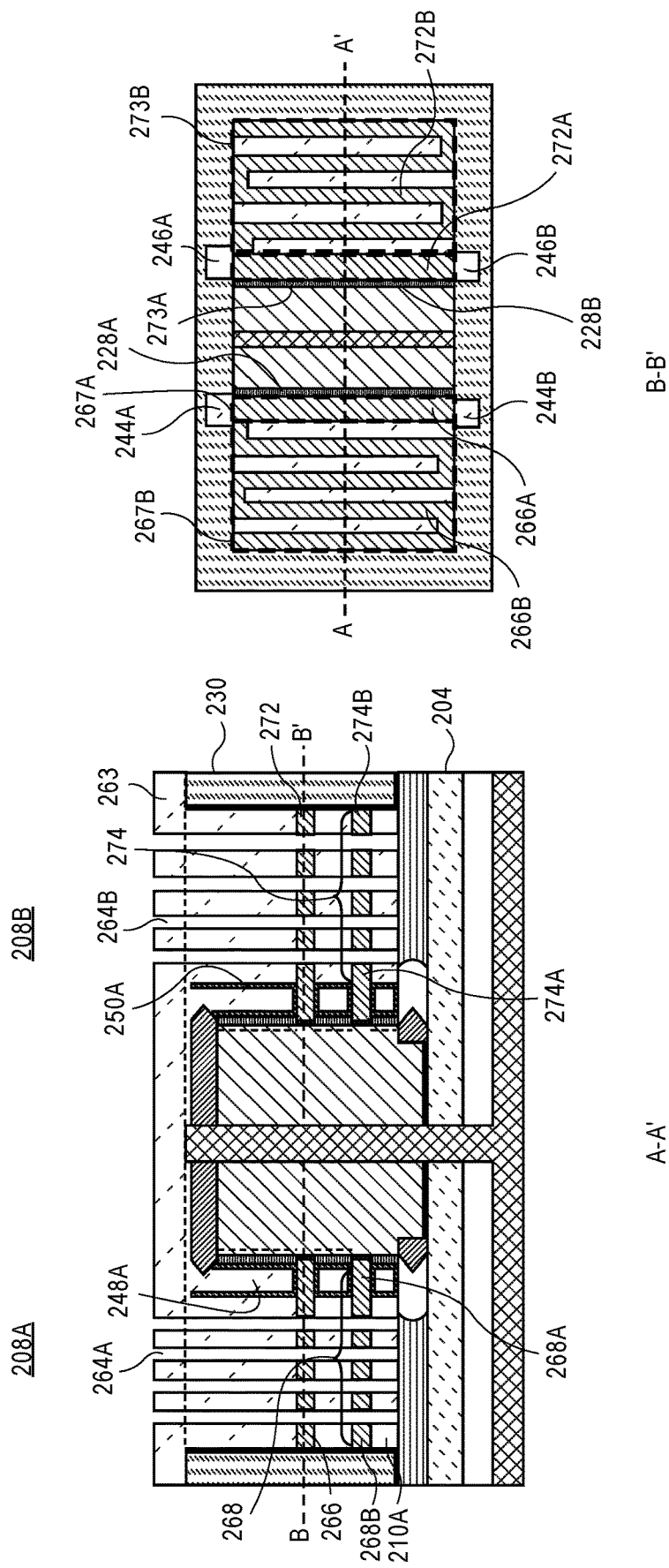

FIG. 17 illustrates the structure of FIG. 16 following the formation of a first and a second resistive gate electrode 266 and 268, respectively in the first patterned material layer stack 208A and a third and a fourth resistive gate electrode 272 & 274, respectively in the second material layer stack 208B.

In an embodiment, a second ILD 263 is blanket deposited on the structure of FIG. 16 filling the lateral openings 248A and 250A and vertical openings 244A, 244B, 246A and 246B. In an embodiment, the second ILD 263 is planarized to form a substantially planar upper most surface. Subsequently, in an embodiment, a meandering pattern is lithographically formed on the second ILD 263 and a plasma etch is performed. In an embodiment, the lithographic mask has a serpentine shaped pattern. In an embodiment, portions of the ILD 218A/218B exposed by the lithographic mask are etched by a first plasma etch process. In an embodiment, serpentine openings 264A and 264B are formed in the first and the second material layer stack 208A and 208B by a second plasma etch process. In an embodiment, gate electrode layers 210A, 210B in the material layer stack 208A are transformed by the plasma etch process into a first and a second resistive gate electrode 266 and 268, respectively. Similarly, in an embodiment, the gate electrode layers 214A and 214B in the material layer stack 208B are transformed by the plasma etch process into a third and a fourth resistive gate electrode 272 and 242, respectively.

In an embodiment, referring to the plan view illustration B-B' in FIG. 17, the serpentine pattern forms a first resistive gate electrode 266 with a gate electrode 266A (inside the dashed lines 267A) formed adjacent to the gate dielectric layer 228A, and a connected first resistive element 266B (inside the dashed lines 267B). Similarly, the serpentine pattern forms a third resistive gate electrode 272 with a third gate electrode 272A (inside the dashed lines 273A) formed adjacent to the gate dielectric layer 228B, and a connected third resistive element 272B (inside the dashed lines 273B).

In an embodiment, the first and second resistive gate electrodes 266 and 268, respectively have shapes that are substantially similar to each other as a result of concurrent patterning process. In an embodiment, second resistive gate electrode 268 has a second gate electrode 268A and a second resistive element 268B. Similarly, in an embodiment, the third and the fourth resistive gate electrodes 272 and 274, respectively have profiles that are substantially similar to each other as a result of the concurrent patterning process. In an embodiment, the fourth resistive gate electrode 274 has a fourth gate electrode 274A and a fourth resistive element 274B.

However, it is to be appreciated that different serpentine patterns may be formed over material layer stack 208A as compared to material layer stack 208B. As discussed above, in an embodiment, the number of turns in a given resistive element will determine the resistance (as discussed above in association with FIG. 1).

Figure 18:
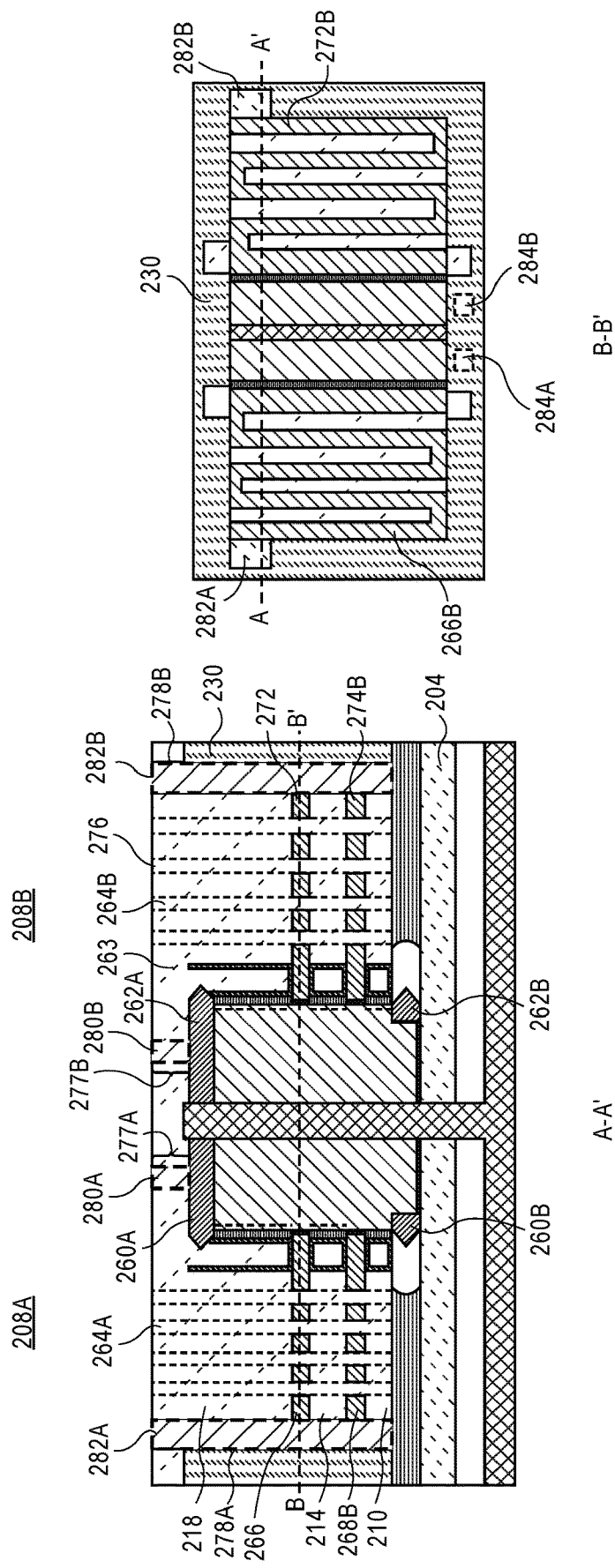

FIG. 18 illustrates the structure of FIG. 17 following the formation of a first drain contact 280A and a second drain contact 280B on the first and second doped drain structures 260A and 262A respectively, formation of a first gate contact 282A adjacent to the first and second resistive gate electrodes 266 and 268 respectively, formation of a second gate contact 282B adjacent to the third and fourth resistive gate electrodes 272 and 274 respectively, and formation of a first source contact 284A and a second source contact 284B on the source metal layer 204.

In an embodiment, a third ILD 276 is blanket deposited on the structure of FIG. 17 and fills the serpentine openings 264A and 264B (indicated by dashed lines) in the first and in the second patterned multilayer stack 208A and 208B, respectively. ILD 276 is substantially similar to the ILD 210, 214, 218 and ILD 263 described above. In an embodiment, the second ILD 276 is planarized to form a substantially planar upper most surface to form contact openings.

In an embodiment, a first and a second drain opening 277A and 277B are formed in the second ILD 263, above the first and second doped drain structures 260A and 262A, respectively. Subsequently, the first and second drain contacts 280A and 280B are formed in the first and second drain openings 277A and 277B. The first and second drain contacts 280A and 280B each have a length and a width that are each in the range of 200-500 nm.

In an embodiment, the gate contact 282A is formed adjacent to the first and second resistive elements 266B and 268B, respectively and the gate contact 282B is formed adjacent to the third and fourth resistive elements 272B, 274B, respectively. In an embodiment, a first gate contact opening 278A and a second gate contact opening 278B are formed in the second ILD 263 and in the second dielectric layer 230. In an embodiment, the first gate contact opening 278A exposes a portion of a sidewall of the first and second resistive elements 266B and 268B, respectively. In an embodiment, the second gate contact opening 278B exposes a portion of a sidewall of the third and fourth resistive elements 272B and 274B, respectively.

In an embodiment, the location of the gate contact openings 278A and 278B are chosen to suitably maximize the resistance of the first and third resistive elements 266B, 272B. To this effect, in an embodiment, the gate contacts 282A and 282B are formed near the termination of the first, second, third and fourth resistive elements 266B, 268B, 272B and 274B, respectively. FIG. 18 (B-B') illustrates the plan view of an embodiment, where the gate contacts 282A and 282B are formed near the termination of the first and third resistive elements 266B and 272B, respectively.

In an embodiment, a first and second source contact openings are formed adjacent to the first and second group III-N semiconductor material 236A and 236B, respectively as illustrated in plan view in FIG. 18 (B-B'). The first and a second source contact openings expose the underlying source metal layer 204, but not the first source structure 260B or the second source structure 262B. Contacts 284A and 284B are formed in the first and second contact openings.

In an embodiment, the various contact structures described above are fabricated sequentially owing to the variations in the depths of the contacts required. In one embodiment, first and second drain contacts 280A and 280B, respectively may be formed first. In other embodiments first and second drain contacts 280A and 280B, respectively may be formed at the end.

Figure 19:
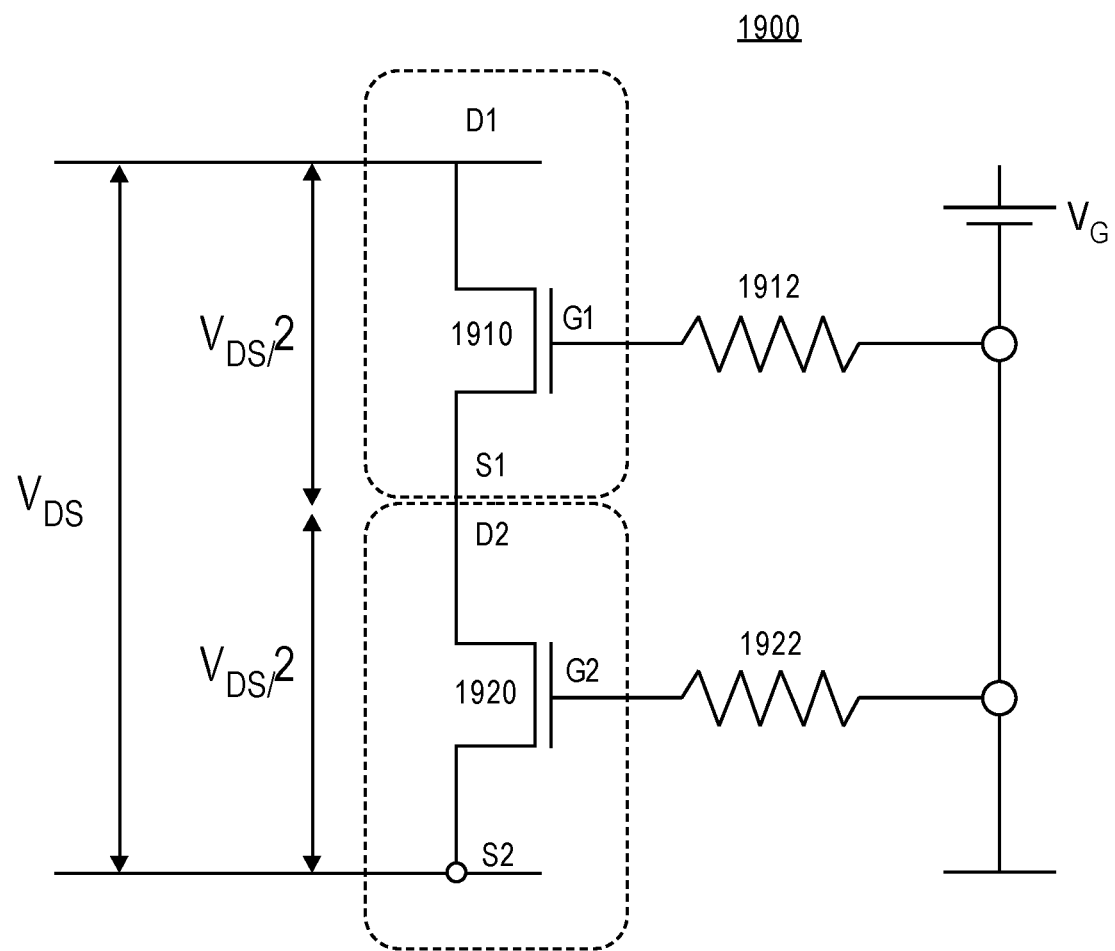
FIG. 19 illustrates a circuit layout with two transistors connected in series, where each transistor has a gate that is connected to a resistor.

FIG. 19 illustrates a circuit layout 1900 demonstrating two transistors connected in series, where each transistor has a gate that is connected to a resistor. In an embodiment, a first transistor 1910 having a gate G1 and a drain D1 is connected to a second transistor 1920 having a gate G2 and a source S2. The source S1 of the first transistor 1910 is also connected to the drain, D2, of second transistor 1910. In an embodiment, the gate G1 of the first transistor 1910 is connected to a first resistor 1912 and the gate G2 of the second transistor 1920 is connected to a second resistor 1922. In an embodiment, the first and second resistors 1912 and 1922, respectively are connected to a common voltage source $V_G$. In an embodiment, Gates G1 and G2 represent stacked gate electrodes 266A and 268A of the first stack 201A of group III-N transistors in FIG. 18. In one such embodiment, the first and second resistors 1912 and 1922, respectively represent the first and second resistive elements 266B and 268B, respectively. In an embodiment the terminal G represents the gate contact 282A, the terminal D1 represents the drain contact 280A and the terminal S2 represents the source metal layer 204.

In an embodiment, when a drain voltage $V_{DS}$, is applied between the drain D1 and the source, S2, and when the transistor gates G1 and G2 are energized above a threshold voltage $V_T$, (by turning on voltage source $V_G$) a channel is formed in each of the first and the second transistors 1910 and 1920, respectively. Current, then, flows between the drain D1 and the source S2. A proportion of the drain voltage $V_{DS}$ drops across each of the first and the second transistors 1910 and 1920, respectively. In an embodiment, the stacked transistor 1900 operates as a RF voltage divider.

Figure 20:
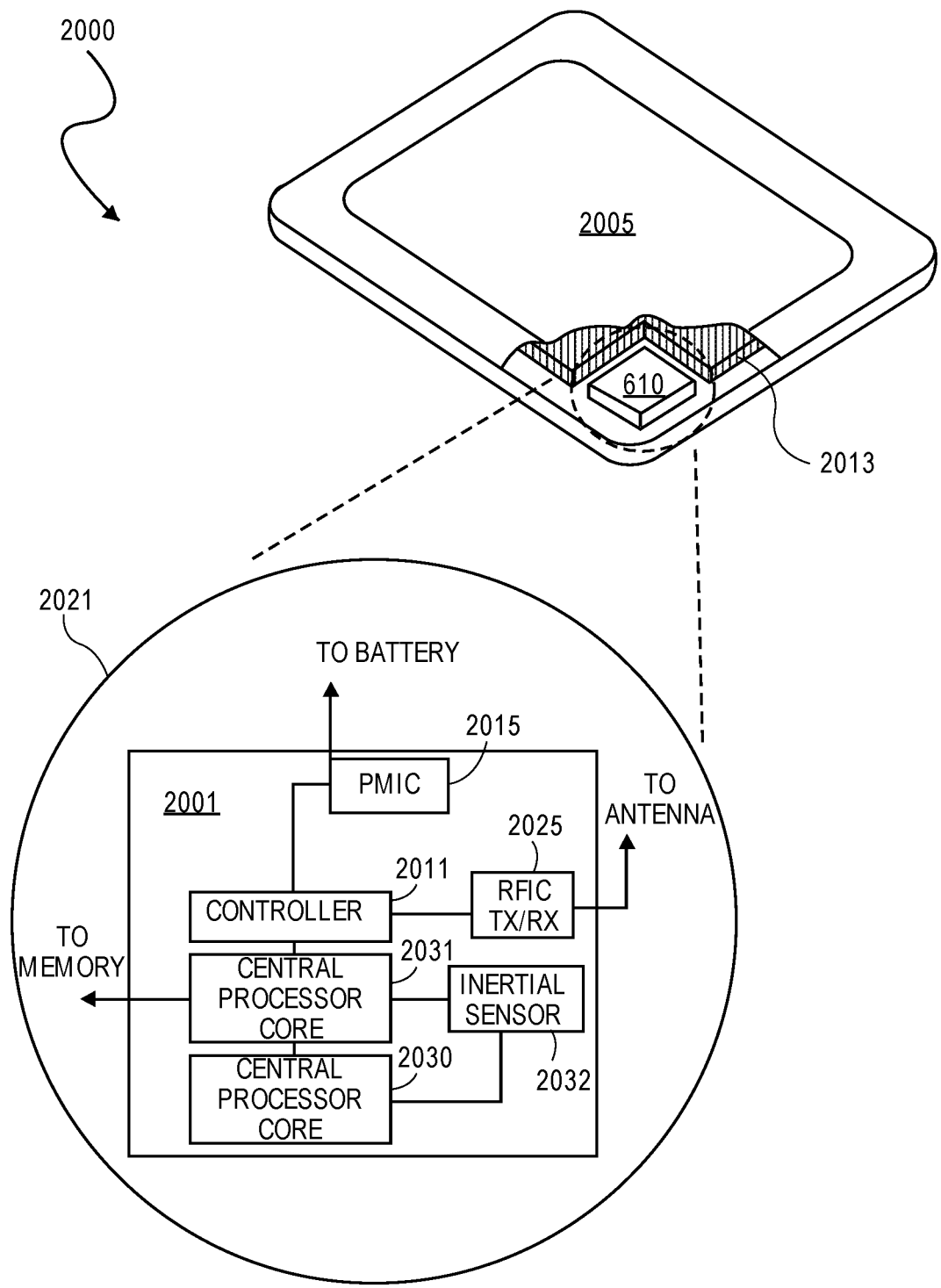
FIG. 20 is a functional block diagram of a group III-N SoC including stack of group III-N transistors of a mobile computing platform, in accordance with an embodiment of the present invention.

FIG. 20 is a functional block diagram of a group III-N SoC implementation of a mobile computing platform, in accordance with an embodiment of the present invention. The mobile computing platform 2000 may be any portable device configured for each of electronic data display, electronic data processing, and wireless electronic data transmission. For example, mobile computing platform 2000 may be any of a tablet, a smart phone, laptop computer, etc. And includes a display screen 2005 that is in the exemplary embodiment a touchscreen (e.g., capacitive, inductive, resistive, etc.) permitting the receipt of user input, the SoC 2010, and a battery 2013. As illustrated, the greater the level of integration of the SoC 2010, the more of the form factor within the mobile computing platform 2000 that may be occupied by the battery 2013 for longest operative lifetimes between charging, or occupied by memory (not depicted), such as a solid state drive, for greatest functionality.

Depending on its applications, mobile computing platform 2000 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, RF switches, a global positioning system (GPS) device, a compass, an accelerometer, a gyroscope, a speaker, a camera, and a mass storage device (such as hard disk drive, compact disk (CD), digital versatile disk (DVD), and so forth).

The SoC 2010 is further illustrated in the expanded view 2021. Depending on the embodiment, the SoC 2010 includes a portion of a substrate 2001 (i.e., a chip) upon which two or more of a power management integrated circuit (PMIC) 2015, RF integrated circuit (RFIC) 2025 including an RF transmitter and/or receiver, a controller thereof 2011, and one or more central processor core 2030, 2031 is fabricated. The RFIC 2025 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC 2025 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 2015 and RFIC 2025. In embodiments of the present invention, the PMIC 2015 and RFIC 2025 employ one or more of the stack of group III-N transistors and RF switches (e.g., stacked group III-N transistor structure 101, 102). In further embodiments the PMIC 2015 and RFIC 2025 employing the stacked group III-N transistor structure described herein are integrated with one or more of the controller 2011 and processor cores 2030, 2031 provided in silicon CMOS technology monolithically integrated with the PMIC 2015 and/or RFIC 2025 onto the (silicon) substrate 2000. It will be appreciated that within the PMIC 2015 and/or RFIC 2025, the high voltage, high frequency capable group III-N transistors described herein need not be utilized in exclusion to CMOS, but rather silicon CMOS may be further included in each of the PMIC 2015 and RFIC 2025.

The stack of group III-N transistors described herein may be specifically utilized where a high voltage swing is present (e.g., 8-10V battery power regulation, DC-to-DC conversion, etc. within the PMIC 2015). As illustrated, in the exemplary embodiment the PMIC 2015 has an input coupled to the battery 2013 and has an output provide a current supply to all the other functional modules in the SoC 2010. In a further embodiment, where additional ICs are provided within the mobile computing platform 2000 but off the SoC 2010, the PMIC 2015 output further provides a current supply to all these additional ICs off the SoC 2010. Particular embodiments of the group III-N transistors described herein permit the PMIC to operate at higher frequencies (e.g., 50× those possible in LDMOS implementations). In certain such embodiments, inductive elements within the PMIC (e.g., buck-boost convertors, etc.) may be scaled to much smaller dimensions. As such inductive elements in the PMIC account for 60-50% of chip area, embodiments of the PMIC implemented in the stacked group III-N transistor structure described herein offer a significant shrink over other architectures.

As further illustrated, in the exemplary embodiment the PMIC 2015 has an output coupled to an antenna and may further have an input coupled to a communication module on the SoC 2010, such as an RI analog and digital baseband module (not depicted). Alternatively, such communication modules may be provided on an IC off-chip from the SoC 2010 and coupled into the SoC 2010 for transmission. Depending on the group III-N materials utilized, stack of group III-N transistors described herein (e.g. stacked group III-N transistor structure 101) may further provide the large power added efficiency (PAE) needed from a power amplifier transistor having an $F_t$ of at least ten times carrier frequency (e.g., a 1.9 GHz in an RFIC 2025 designed for 3G or GSM cellular communication).

Figure 21:
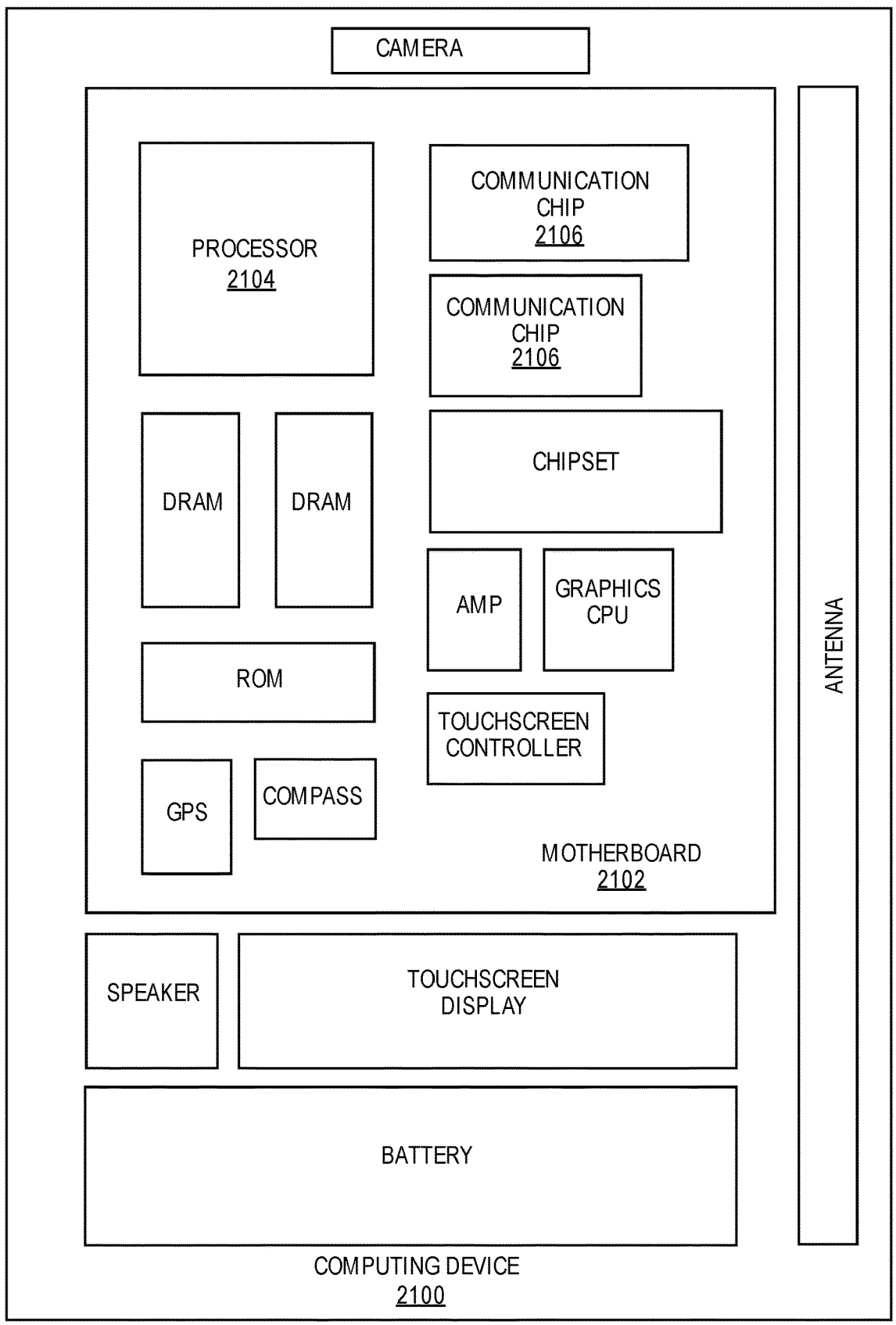
FIG. 21 illustrates a computing device in accordance with embodiments of the present invention.

FIG. 21 illustrates a computing device in accordance with embodiments of the present invention. FIG. 21 illustrates an example computing device 2100 implemented with the integrated circuit structures and/or techniques provided herein, in accordance with some embodiments of the present disclosure. As can be seen, the computing device 2100 houses a motherboard 2102. The motherboard 2102 may include a number of components, including, but not limited to, a processor 2104 that includes stack of group III-N transistors integrated with silicon CMOS transistors and at least one communication chip 2106, each of which can be physically and electrically coupled to the motherboard 2102, or otherwise integrated therein. As will be appreciated, the motherboard 2102 may be, for example, any printed circuit board, whether a main board, a daughterboard mounted on a main board, or the only board of system 2100, etc.

Depending on its applications, computing device 2100 may include one or more other components that may or may not be physically and electrically coupled to the motherboard 2102. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing device 2100 may include one or more stack of group III-N transistors formed using the disclosed techniques in accordance with an example embodiment or stack of group III-N transistors integrated with silicon CMOS transistor devices. In some embodiments, multiple functions can be integrated into one or more chips (e.g., for instance, note that the communication chip 2106 can be part of or otherwise integrated into the processor 2104).

The communication chip 2106 enables wireless communications for the transfer of data to and from the computing device 2100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2106 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2100 may include a plurality of communication chips 2106. For instance, a first communication chip 2106 may be dedicated to shorter range wireless communications such as Wi-Fi and Bluetooth and a second communication chip 2106 may be dedicated to longer range wireless communications such as GPS, EDGE, GPRS, CDMA, WiMAX, LTE Ev-DO, and others. In some embodiments, communication chip 2106 may be implemented with the techniques and/or structures variously described herein, such that the communication chip 2106 includes one or more stacks of group III-N transistors including a first stack 101 and second stack 102 of group III-N transistors sharing a common source, for example.

The processor 2104 of the computing device 2100 includes an integrated circuit die packaged within the processor 2104. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 2106 also may include an integrated circuit die packaged within the communication chip 2106. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 2104 (e.g., where functionality of any chips 2106 is integrated into processor 2104, rather than having separate communication chips). Further note that processor 2104 may be a chip set having such wireless capability. In short, any number of processor 2104 and/or communication chips 2106 can be used. Likewise, any one chip or chip set can have multiple functions integrated therein.

In various implementations, the computing device 2100 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Figure 22:
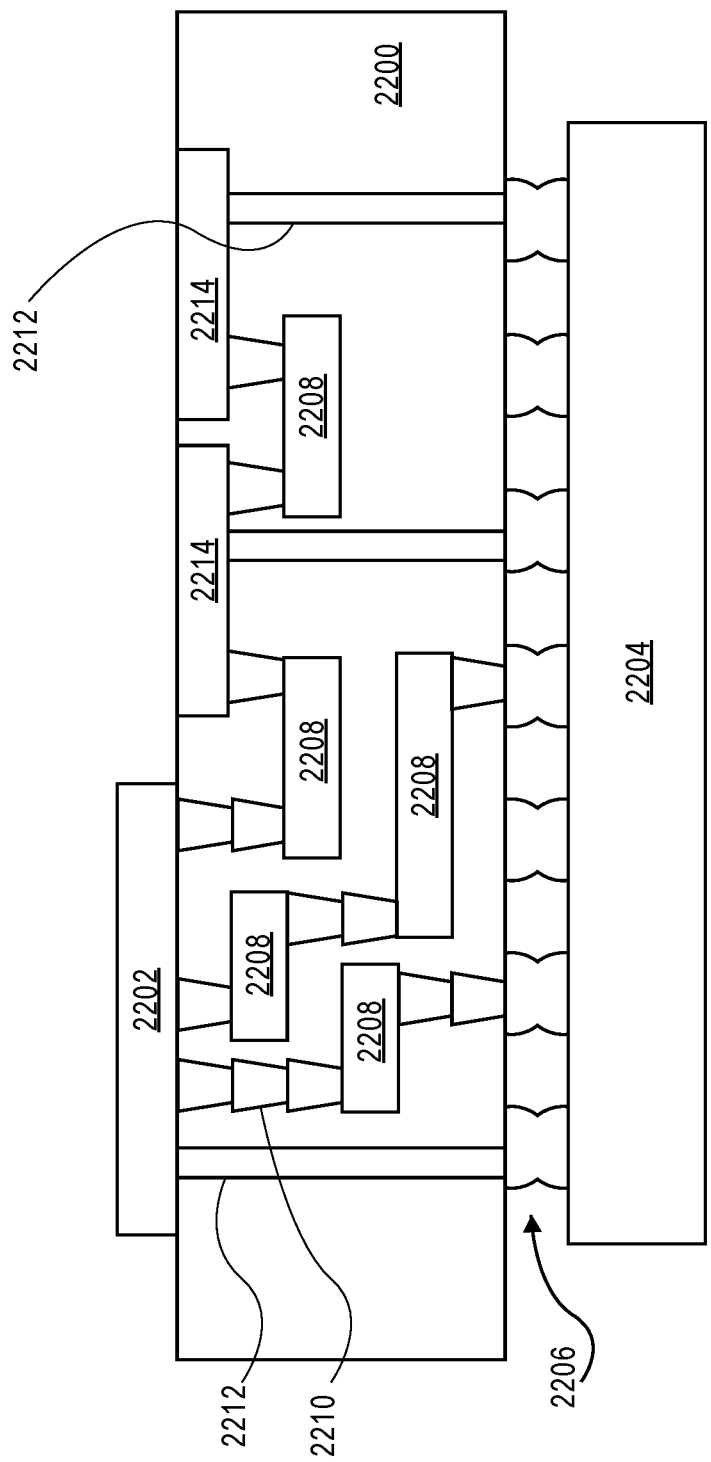
FIG. 22 illustrates an interpose accordance embodiments of the present invention.

FIG. 22 illustrates an interposer 2200 in accordance with embodiments of the present invention. The interposer 2200 that includes one or more embodiments of the invention. The interposer 2200 is an intervening substrate used to bridge a first substrate 2202 to a second substrate 2204. The first substrate 2202 may be, for instance, an integrated circuit die. The second substrate 2204 may be, for instance, a module including stack of group III-N transistors for an RF switch, a memory module, a computer motherboard, or another integrated circuit die. Generally, the purpose of an interposer 2200 is to spread a connection to a wider pitch or to reroute a connection to a different connection. For example, an interposer 2200 may couple an integrated circuit die to a ball grid array (BGA) 2206 that can subsequently be coupled to the second substrate 2204. In some embodiments, the first and second substrates 2202/2204 are attached to opposing sides of the interposer 2200. In other embodiments, the first and second substrates 2202/2204 are attached to the same side of the interposer 2200. And in further embodiments, three or more substrates are interconnected by way of the interposer 2200.

The interposer 2200 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 2208 and vias 2200, including but not limited to through-silicon vias (TSVs) 2212. The interposer 2200 may further include embedded devices 2214, including both passive and active devices. Such devices include, but are not limited to, capacitors, decoupling capacitors, resistors, inductors, fuses, diodes, transformers and sensors. More complex devices such as radio-frequency (RF) devices, RF switch structures with stack of group III-N transistors such as stacked group III-N transistor structure 101, power amplifiers, power management devices, antennas, arrays, sensors, and MEMS devices may also be formed on the interposer 2200. In accordance with embodiments of the invention, apparatuses or processes disclosed herein may be used in the fabrication of interposer 2200.

Thus, embodiments of the present invention include stacked group III-N transistors for an RF switch and their methods of fabrication.

Example 1: A semiconductor device including a silicon pillar is disposed on a substrate. The silicon pillar has a sidewall. A group III-nitride (N) semiconductor material is disposed on the sidewall of the silicon pillar. The group III-N semiconductor material has a sidewall, an uppermost surface and a lowermost surface. A doped source structure is disposed on the group III-N semiconductor material. A doped drain structure is disposed on the group III-N semiconductor material, wherein the doped drain structure is spaced apart from the doped source structure. A first gate dielectric layer is disposed on the sidewall of the group III-N semiconductor material. The first gate dielectric layer is between the doped source structure and the doped drain structure. A first resistive gate electrode is disposed on the first gate dielectric layer. A second gate dielectric layer is disposed on the group III-N semiconductor material, the second gate dielectric layer is between the doped source structure and the doped drain structure and spaced apart from the first gate dielectric layer. A second resistive gate electrode is disposed on the second gate dielectric layer. A polarization charge inducing layer is disposed on the sidewall of the group III-N semiconductor material. The polarization charge inducing layer is between the doped drain structure and the first gate dielectric layer. The polarization charge inducing layer is between the first gate dielectric layer and the second gate dielectric layer, and the polarization charge inducing layer is between the second gate dielectric layer and the doped source structure. A source metal layer is disposed below and in contact with the doped source structure.

Example 2: The semiconductor structure of Example 1, includes a first gate electrode that is in contact with the first gate dielectric layer and further includes a first resistor that has a serpentine shape. The second resistive gate electrode includes a second gate electrode that is in contact with the second gate dielectric layer and includes a second resistor that has the serpentine shape.

Example 3: The semiconductor structure of Example 1, wherein the group III-N semiconductor material includes gallium nitride (GaN).

Example 4: The semiconductor structure of Example 1, wherein the polarization charge inducing layer includes a group III-N semiconductor material that includes aluminum.

Example 5: The semiconductor structure of Example 1 and Example 3, wherein the doped drain structure is disposed on an uppermost surface of the group III-N semiconductor material and the doped source structure is disposed on the sidewall of the group III-N semiconductor material.

Example 6: The semiconductor structure of Example 1 and Example 3, wherein the source metal layer is below the group III-N semiconductor material.

Example 7: The semiconductor structure of Example 1 and Example 5, wherein the doped source structure and the doped drain structure include n-type impurity dopants.

Example 8: The semiconductor structure of Example 1 and Example 2, wherein the resistive gate electrode has a resistance of at least 50 Kohm.

Example 9: A semiconductor device including a silicon pillar is disposed on a substrate. The silicon pillar having a first sidewall and a second sidewall opposite to the first sidewall. A first group III-N semiconductor material is disposed on the first sidewall of the silicon pillar. The first group III-N semiconductor material has an uppermost surface, a lower most surface, a first sidewall adjacent to the first sidewall of the silicon pillar and a second sidewall opposite to the first sidewall. A second group III-N semiconductor material is disposed on the second sidewall of the silicon pillar. The second group III-N semiconductor material has an uppermost surface, a lower most surface, a first sidewall adjacent to the second sidewall of the silicon pillar and a second sidewall opposite to the first sidewall. A first doped source structure is disposed on the second sidewall of the first group III-N semiconductor material, and a second doped source structure is disposed on the second sidewall of the second group III-N semiconductor material. A first doped drain structure is disposed on the uppermost surface of the first group III-N semiconductor material and a second doped drain structure is disposed on the uppermost surface of the second group III-N semiconductor material. A first polarization charge inducing layer is disposed on the second sidewall of the first group III-N semiconductor material between the first doped drain structure and the first doped source structure. A second polarization charge inducing layer is disposed on the second sidewall of the second group III-N semiconductor material between the second doped drain structure and the second doped source structure. A first gate dielectric layer and a second gate dielectric layer is disposed on the second sidewall of the first group III-N semiconductor material. The first gate dielectric layer and the second gate dielectric layer are separated by the first polarization charge inducing layer. A first resistive gate electrode is disposed adjacent to the first gate dielectric layer and a second resistive gate electrode is disposed adjacent to the second gate dielectric layer. A third gate dielectric layer and a fourth gate dielectric layer are disposed on the second sidewall of the second group III-N semiconductor material. The third gate dielectric layer and the fourth gate dielectric layer are separated by the second polarization charge inducing layer. A third resistive gate electrode is disposed adjacent to the third gate dielectric layer and a fourth resistive gate electrode is disposed adjacent to the fourth gate dielectric layer. A source metal with a first portion is disposed below the first group III-N semiconductor material and a second portion is disposed below the second group III-N semiconductor material. A first drain contact is disposed above the first doped drain structure and a second drain contact is disposed above the second doped drain structure.

Example 10: The semiconductor structure of Example 9, wherein each of the resistive gate electrodes includes a gate electrode portion that is in contact with the gate dielectric layer and a serpentine shaped resistive element, further wherein the gate electrode portion and the serpentine shaped resistive element are contiguous.

Example 11: The semiconductor structure of Example 9 and Example 10, wherein the each of the plurality of resistive gate electrodes are electrically coupled to each other.

Example 12: The semiconductor structure of Example 9, wherein the group III-N semiconductor material includes gallium nitride (GaN).

Example 13: The semiconductor structure of Example 9, wherein the polarization charge inducing layer includes a group III-N semiconductor material that includes aluminum.

Example 14: The semiconductor structure of Example 9, wherein the first and second doped source structures and the first and second doped drain structures include n-type impurity dopants.

Example 15: The semiconductor structure of Example 9 and Example 10, wherein each resistive gate electrode has a resistance that is at least 50 KOhm.

Example 16: The semiconductor structure of Example 9, wherein the first and second portions of the source metal are electrically coupled to each other.

Example 17: A method of fabricating a semiconductor device includes forming a source metal layer above a substrate. The method further includes forming a material layer stack comprising of a plurality of alternating layers of interlayer dielectric (ILD) and gate electrode layer above the source metal layer. A first patterned material layer stack and a second patterned material layer stack are formed above the source metal layer. A gate dielectric layer is formed on the sidewalls of the first and the second patterned material layer stacks. The method further includes forming an epitaxially grown silicon pillar on the substrate in a region between the first and the second patterned material layer stacks. A group III-N semiconductor material is formed in a first region between the silicon pillar and the first patterned material layer stack and in a second region between the silicon pillar and the second patterned material layer stack. Openings are formed in the plurality of ILD layers adjacent to the gate dielectric layer in the first and in the second patterned material layer stacks. Portions of the gate dielectric layer are removed from the sidewalls of the group III-N semiconductor material in each of the first and second regions. A plurality of portions of a polarization charge inducing layer are formed on the exposed sidewalls of the group III-N semiconductor material in each of the first and second regions. A doped source structure and a doped drain structure is formed on the group III-N semiconductor material formed in the first region and in the second region. Patterns are formed in the first and second patterned material layer stacks to create a first stack of resistive gate electrodes and a second stack of resistive gate electrodes. A drain contact is formed on the doped drain structure in each of the first and second regions.

Example 18: The method of Example 17, wherein forming the group III-N semiconductor material, includes forming the group III-N semiconductor material adjacent to the gate dielectric layer.

Example 19: The method of Example 17, wherein removing portions of the gate dielectric layer from the sidewalls of the group III-N semiconductor includes leaving a portion of the gate dielectric layer adjacent to each of the plurality of gate electrode layers.

Example 20: The method of Example 17 and Example 18, wherein the doped source structure, is formed on the sidewall of the group III-N semiconductor material.

Example 21: The method of Example 17 and Example 18, wherein the doped drain structure, is formed on an uppermost surface of the group III-N semiconductor material.

Example 22: The method of Example 17 and Example 18, wherein forming the gate dielectric layer, includes forming the gate dielectric layer below the group III-N semiconductor material.

What is claimed is:
1. A semiconductor device comprising:
a silicon pillar disposed on a substrate, the silicon pillar having a sidewall;
a group III-nitride (N) semiconductor material disposed on the sidewall of the silicon pillar, the group III-N semiconductor material having a sidewall, an uppermost surface and a lowermost surface;
a doped source structure disposed on the group III-N semiconductor material;
a doped drain structure disposed on the group III-N semiconductor material, wherein the doped drain structure is spaced apart from the doped source structure;
a first gate dielectric layer disposed on the sidewall of the group III-N semiconductor material, the first gate dielectric layer between the doped source structure and the doped drain structure;
a first resistive gate electrode disposed on the first gate dielectric layer;
a second gate dielectric layer disposed on the group III-N semiconductor material, the second gate dielectric layer between the doped source structure and the doped drain structure and spaced apart from the first gate dielectric layer;
a second resistive gate electrode disposed on the second gate dielectric layer;
a polarization charge inducing layer disposed on the sidewall of the group III-N semiconductor material, the polarization charge inducing layer between the doped drain structure and the first gate dielectric layer, the polarization charge inducing layer between the first gate dielectric layer and the second gate dielectric layer, and the polarization charge inducing layer between the second gate dielectric layer and the doped source structure; and
a source metal layer disposed below and in contact the doped source structure.

2. The semiconductor device of claim 1, wherein the first resistive gate electrode includes a first gate electrode that is in contact with the first gate dielectric layer and includes a first resistor that has a serpentine shape, and wherein the second resistive gate electrode includes a second gate electrode that is in contact with the second gate dielectric layer and includes a second resistor that has the serpentine shape.

3. The semiconductor device of claim 1, wherein the group III-N semiconductor material includes gallium nitride (GaN).

4. The semiconductor device of claim 1, wherein the polarization charge inducing layer includes a group III-N semiconductor material that includes aluminum.

5. The semiconductor device of claim 1, wherein the doped drain structure is disposed on an uppermost surface of the group III-N semiconductor material and the doped source structure is disposed on the sidewall of the group III-N semiconductor material.

6. The semiconductor device of claim 1, wherein the source metal layer is below the group III-N semiconductor material.

7. The semiconductor device of claim 1, wherein the doped source structure and the doped drain structure include n-type impurity dopants.

8. The semiconductor device of claim 1, wherein the resistive e electrode has a resistance of at least 50 Kohm.

9. A semiconductor device, comprising:
a silicon pillar disposed on a substrate, the silicon pillar having a first sidewall and a second sidewall opposite to the first sidewall;
a first group III-N semiconductor material disposed on the first sidewall of the silicon pillar, the first group III-N semiconductor material having an uppermost surface, a lower most surface, a first sidewall adjacent to the first sidewall of the silicon pillar and a second sidewall opposite to the first sidewall;
a second group III-N semiconductor material disposed on the second sidewall of the silicon pillar, the second group III-N semiconductor material having an uppermost surface, a lower most surface, a first sidewall adjacent to the second sidewall of the silicon pillar and a second sidewall opposite to the first sidewall;
a first doped source structure disposed on the second sidewall of the first group III-N semiconductor material, and a second doped source structure disposed on the second sidewall of the second group III-N semiconductor material;

a first doped drain structure disposed on the uppermost surface of the first group III-N semiconductor material and a second doped drain structure disposed on the uppermost surface of the second group III-N semiconductor material;

a first polarization charge inducing layer, disposed on the second sidewall of the first group III-N semiconductor material between the first doped drain structure and the first doped source structure;

a second polarization charge inducing layer, disposed on the second sidewall of the second group III-N semiconductor material between the second doped drain structure and the second doped source structure;

a first gate dielectric layer and a second gate dielectric layer disposed on the second sidewall of the first group III-N semiconductor material; the first gate dielectric layer and the second gate dielectric layer separated by the first polarization charge inducing layer;

a first resistive gate electrode disposed adjacent to the first gate dielectric layer and a second resistive gate electrode disposed adjacent to the second gate dielectric layer;

a third gate dielectric layer and a fourth gate dielectric layer disposed on the second sidewall of the second group III-N semiconductor material; the third gate dielectric layer and the fourth gate dielectric layer separated by the second polarization charge inducing layer;

a third resistive gate electrode disposed adjacent to the third gate dielectric layer and a fourth resistive gate electrode disposed adjacent to the fourth gate dielectric layer;

a source metal having a first portion disposed below the first group III-N semiconductor material and a second portion disposed below the second group III-N semiconductor material; and a first drain contact disposed above the first doped drain structure and a second drain contact disposed above the second doped drain structure.

10. The semiconductor device of claim 9, wherein each of the resistive gate electrodes includes a gate electrode portion that is in contact with the gate dielectric layer and a serpentine shaped resistive element, further wherein the gate electrode portion and the serpentine shaped resistive element are contiguous.

11. The semiconductor device of claim 9, wherein the each of the plurality of resistive gate electrodes are electrically coupled to each other.

12. The semiconductor device of claim 9, wherein the group III-N semiconductor material includes gallium nitride (GaN).

13. The semiconductor device of claim 9, wherein the polarization charge inducing layer includes a group III-N semiconductor material that includes aluminum.

14. The semiconductor device of claim 9, wherein the first and second doped source structures and the first and second doped drain structures include n-type impurity dopants.

15. The semiconductor structure of claim 9, wherein each resistive gate electrode has a resistance that is at least 50 KOhm.

16. The semiconductor device of claim 9, wherein the first and second portions of the source metal are electrically coupled to each other.

17. A method of fabricating a semiconductor device, the method comprising:
  forming a source metal layer above a substrate;
  forming a material layer stack comprising of a plurality of alternating layers of interlayer dielectric (ILD) and gate electrode layer above the source metal layer;
  forming a first patterned material layer stack and a second patterned material layer stack above the source metal layer;
  forming a gate dielectric layer on the sidewalk of the first and the second patterned material layer stacks;
  forming an epitaxially grown silicon pillar on the substrate in a region between the first and the second patterned material layer stacks;
  forming a group III-N semiconductor material in a first region between the silicon pillar and the first patterned material layer stack and in a second region between the silicon pillar and the second patterned material layer stack;
  forming openings in the plurality of ILD layers adjacent to the gate dielectric layer in the first and in the second patterned material layer stacks;
  removing portions of the gate dielectric layer from the sidewalk of the group III-N semiconductor material in each of the first and second regions;
  forming a plurality of portions of a polarization charge inducing layer on the exposed sidewalls of the group III-N semiconductor material in each of the first and second regions;
  forming a doped source structure and a doped drain structure on the group III-N semiconductor material formed in the first region and in the second region;
  forming patterns in the first and second patterned material layer stacks to create a first stack of resistive gate electrodes and a second stack of resistive gate electrodes; and
  forming a drain contact on the doped drain structure in each of the first and second regions.

18. The method of claim 17, wherein forming the group III-N semiconductor material, includes forming the group III-N semiconductor material adjacent to the gate dielectric layer.

19. The method of claim 17, wherein removing portions of the gate dielectric layer from the sidewalls of the group III-N semiconductor includes leaving a portion of the gate dielectric layer adjacent to each of the plurality of gate electrode layers.

20. The method of claim 17, wherein the doped source structure, is formed on the sidewall of the group III-N semiconductor material.

21. The method of claim 17, wherein the doped drain structure, is formed on an uppermost surface of the group III-N semiconductor material.

22. The method of claim 17, wherein forming the gate dielectric layer, includes forming the gate dielectric layer below the group III-N semiconductor material.

* * * * *